United States Patent [19]
Bazes

[11] Patent Number: 5,581,207
[45] Date of Patent: Dec. 3, 1996

[54] SYNCHRONOUS DELAY LINE

[75] Inventor: Mel Bazes, Haifa, Israel

[73] Assignee: Intel Corporation, Santa Clara, Calif.

[21] Appl. No.: 509,116

[22] Filed: Jul. 28, 1995

[51] Int. Cl.$^6$ .............................. H03K 5/13; H03K 7/00
[52] U.S. Cl. ......................... 327/261; 327/269; 327/161; 327/277
[58] Field of Search .................................. 327/261, 264, 327/269, 270, 271, 272, 276, 277, 278, 284, 285, 292, 266, 274, 91, 94, 95, 141, 146, 149, 153, 155, 158, 161, 162, 163

[56] References Cited

U.S. PATENT DOCUMENTS

| | | | |
|---|---|---|---|
| 4,476,401 | 10/1984 | Lin ......................................... | 307/269 |
| 4,496,861 | 1/1985 | Bazes ..................................... | 307/602 |
| 4,975,605 | 12/1990 | Bazes ..................................... | 307/606 |
| 4,994,695 | 2/1991 | Bazes ..................................... | 307/602 |
| 5,012,142 | 4/1991 | Sonntag ................................. | 327/292 |
| 5,036,230 | 7/1991 | Bazes ..................................... | 327/107 |
| 5,173,870 | 12/1992 | Sukashita et al. ...................... | 364/754 |
| 5,272,390 | 12/1993 | Watson, Jr. et al. .................... | 327/261 |
| 5,298,866 | 3/1994 | Kaplinsky ............................... | 327/261 |
| 5,365,128 | 11/1994 | Bazes ..................................... | 327/141 |

OTHER PUBLICATIONS

"A Novel Precision MOS Synchronous Delay Line" *IEEE Journal of Solid State Circuits*, vol. SC-20, pp. 1265–1271, Dec. 1985.

*Primary Examiner*—Timothy P. Callahan
*Assistant Examiner*—Eunja Shin
*Attorney, Agent, or Firm*—Blakely, Sokoloff, Taylor & Zafman

[57] ABSTRACT

An improved high precision synchronous delay line featuring propagation control circuitry in the voltage controlled delay line removing skew between a pair of propagated waveforms. A pair of waveforms are received by the voltage controlled delay line of the synchronous delay line. The voltage controlled delay line features propagation control circuitry which couples together the propagation of the pair of waveforms through the present invention. If a transition from one level to another level occurs on any one of the received pair of waveforms, the propagation control circuitry prevents the transition from propagating until a corresponding transition occurs on the other one of the pair of waveforms. As a result, any skew that is created between the pair of waveforms, for any reason, is removed by the propagation control circuitry. With the skew removed, the presently improved synchronous delay line features increased precision and provides for greater resolution. The present invention also includes an improved wave generator, an improved phase generator, and an improved sample and hold circuit. The present wave generator and phase generator include internal circuitry matched with internal circuitry featured in the present voltage controlled delay line. With the matched internal circuitry, the waveforms propagated through each of the improved elements have uniform transition times which provide the presently improved synchronous delay line with increased precision. The present sample and hold circuit includes phase detection circuitry which provides the present invention with accurate control to maintain the precision of the present synchronous delay line.

56 Claims, 14 Drawing Sheets

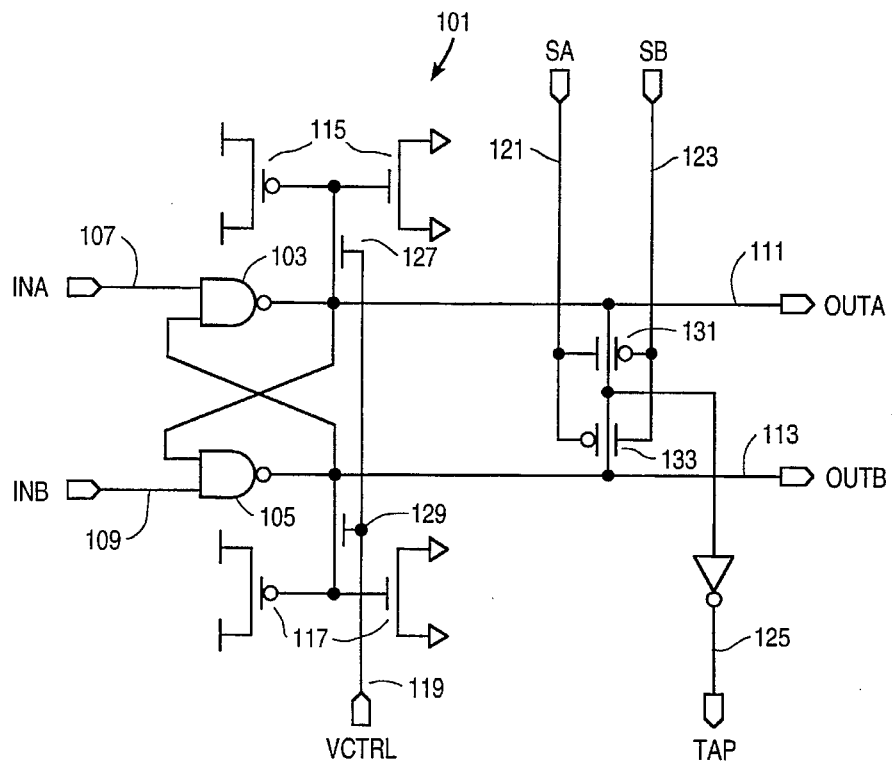
FIG_1A (PRIOR ART)
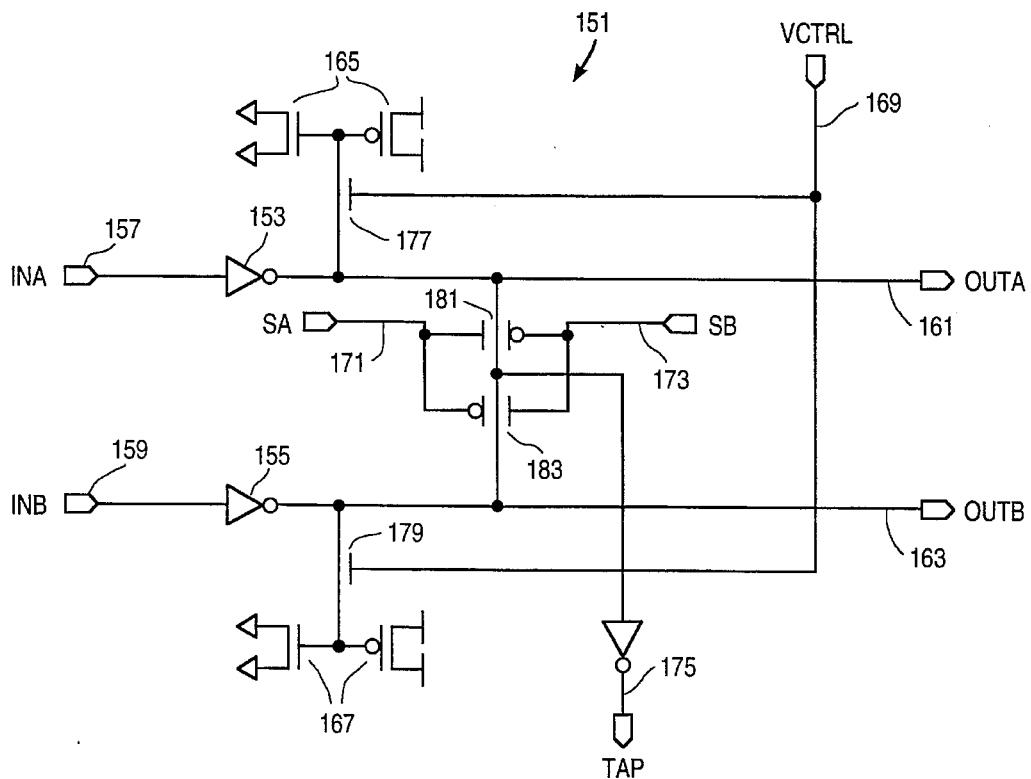
FIG_1B (PRIOR ART)

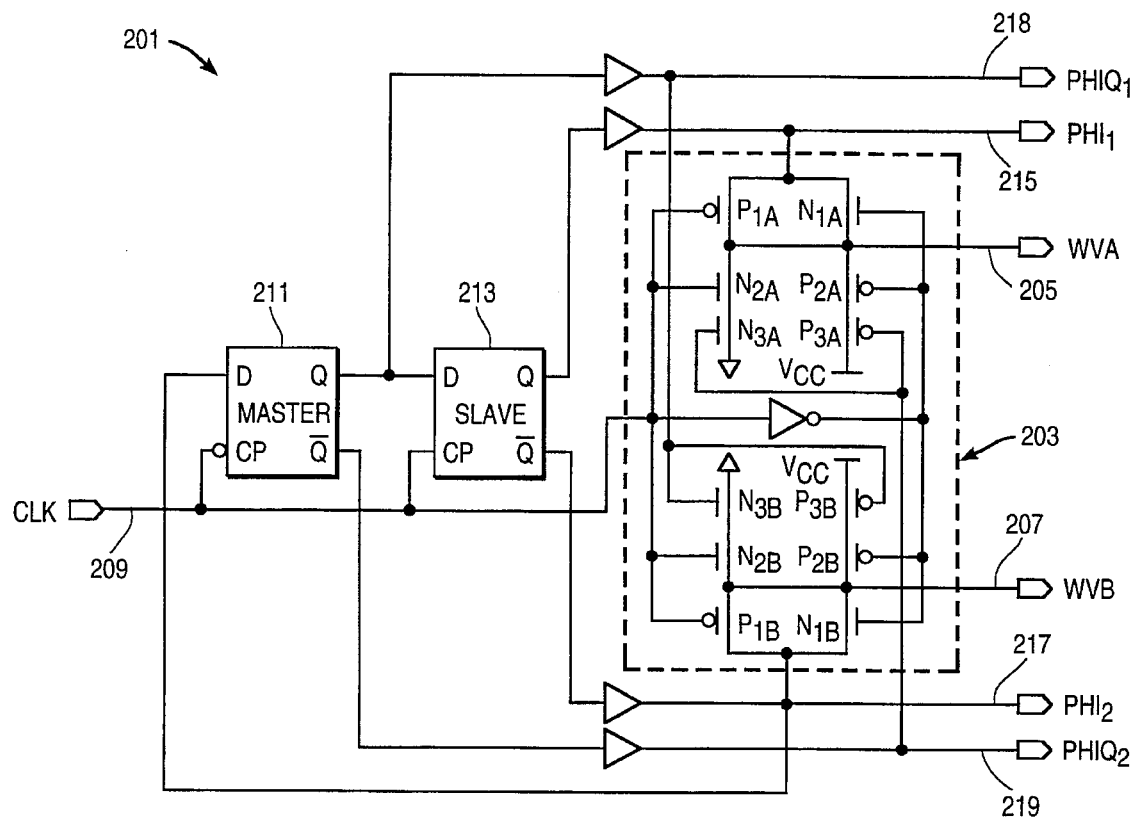
FIG_2 (PRIOR ART)
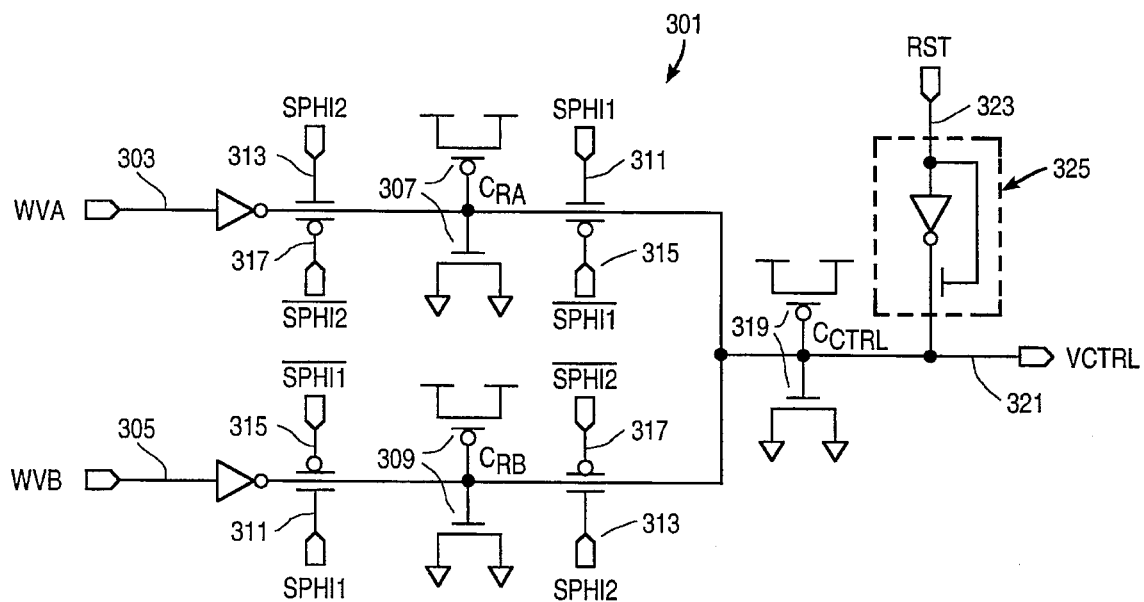
FIG_3 (PRIOR ART)

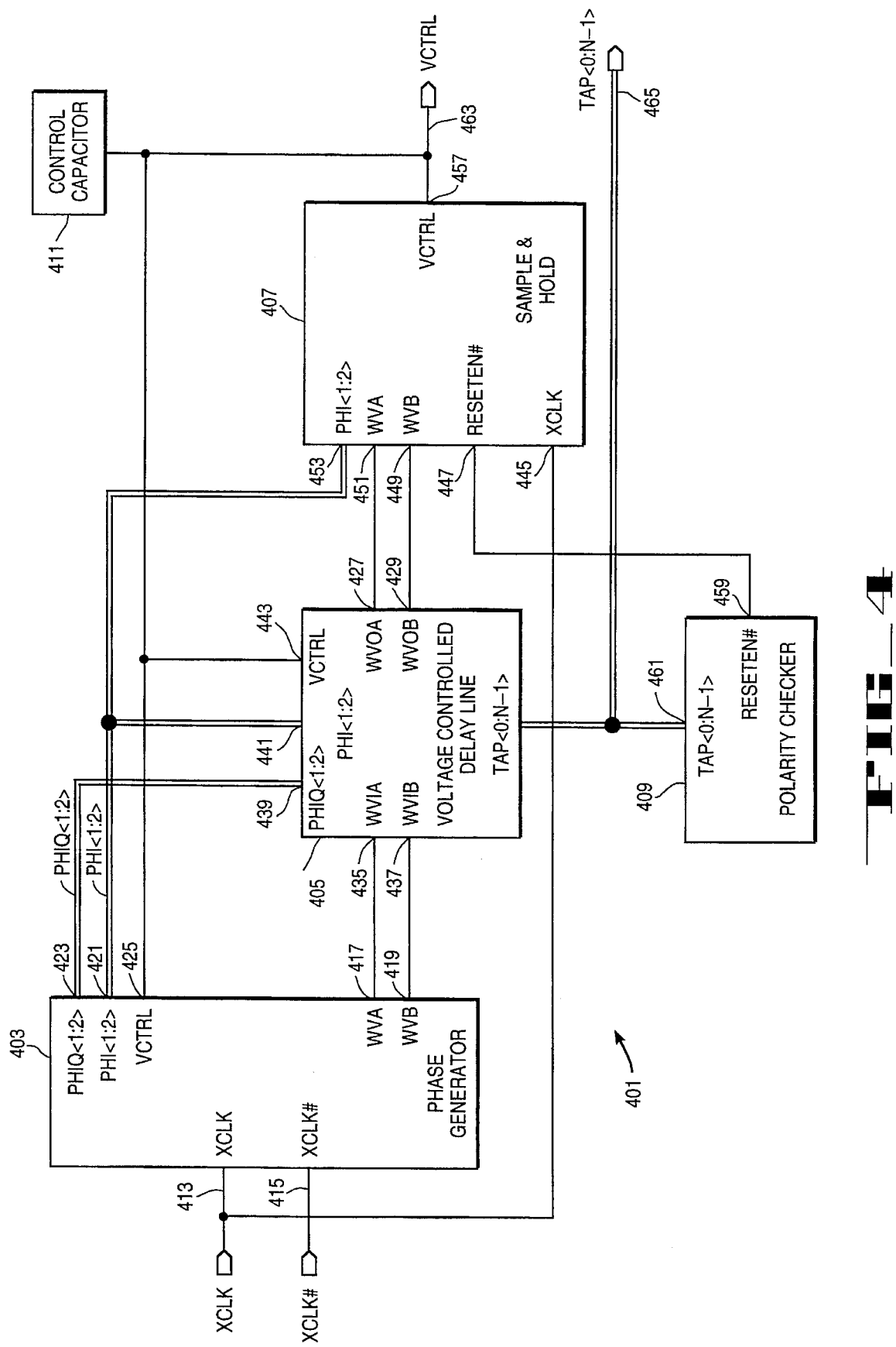
FIG_4

FIGURE 5B →

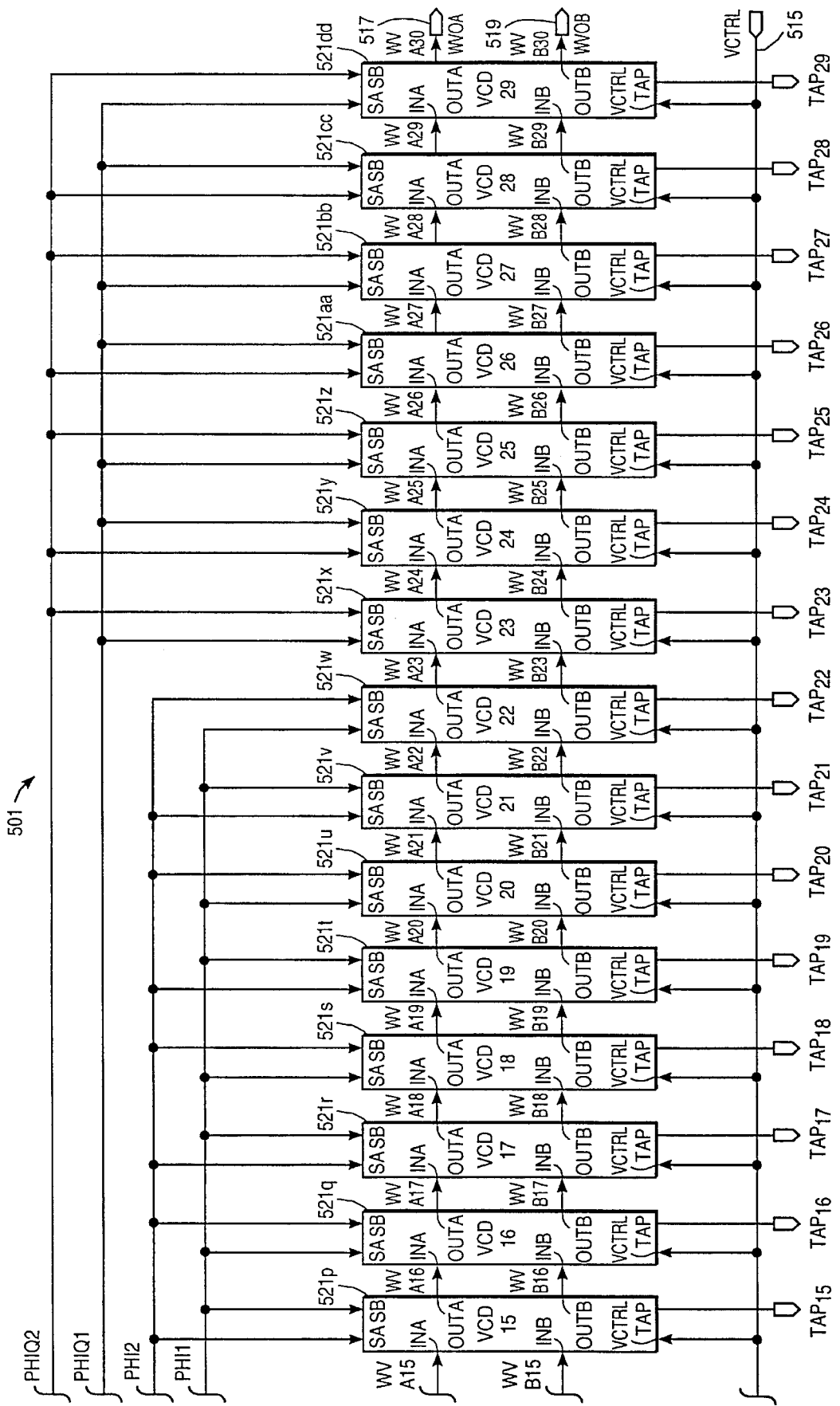
FIG. 5B — FIGURE 5A

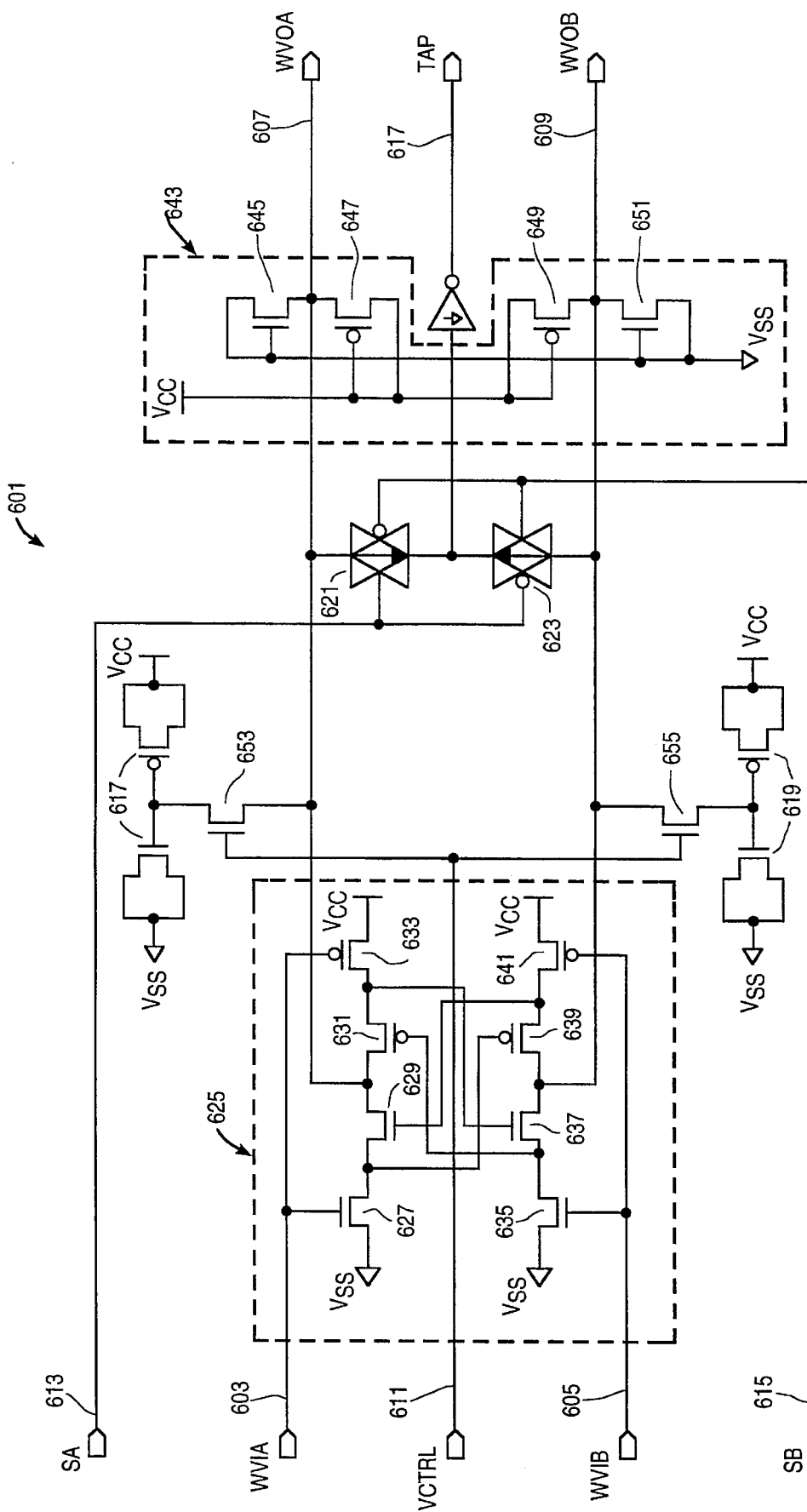
FIG_5

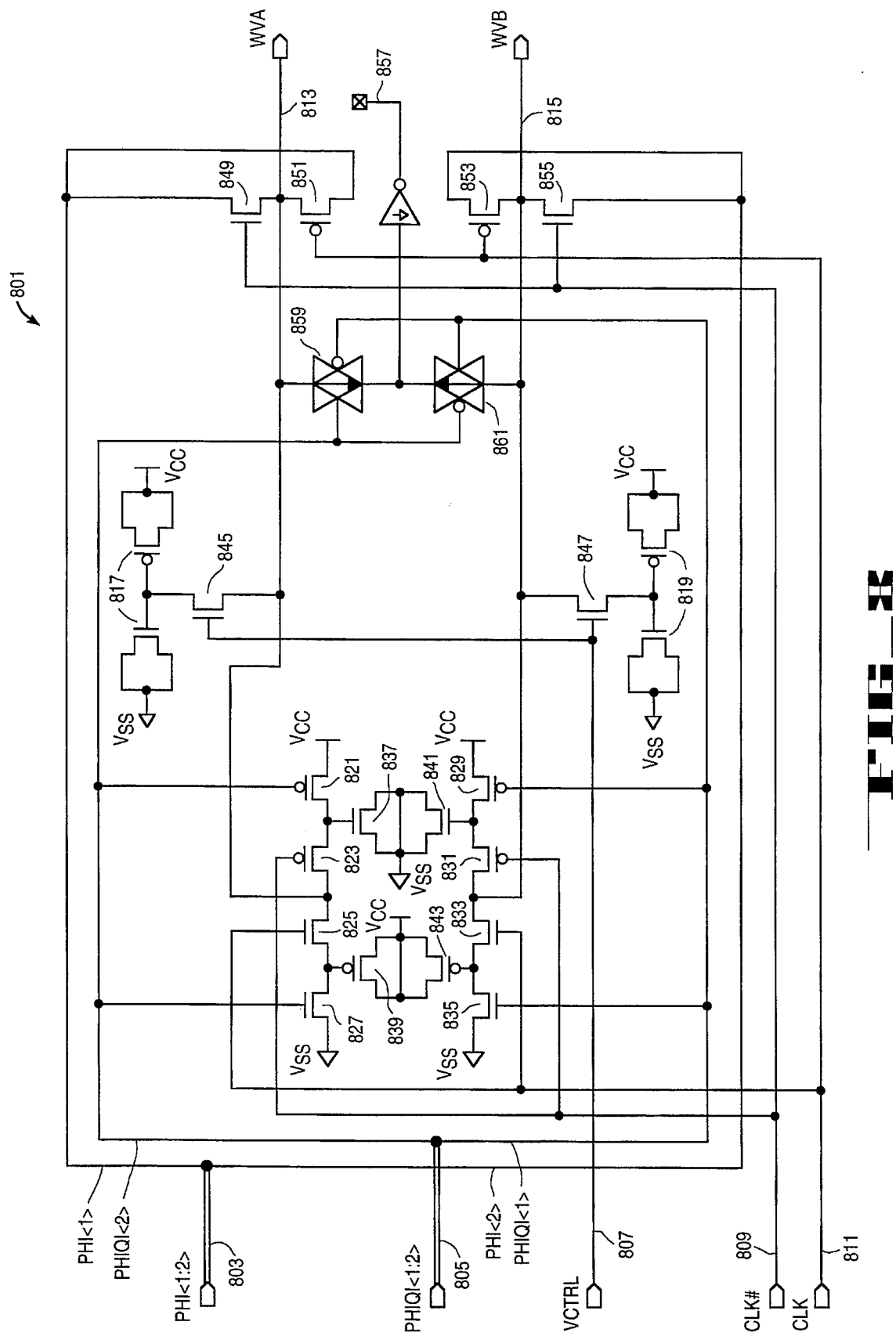
FIG._8

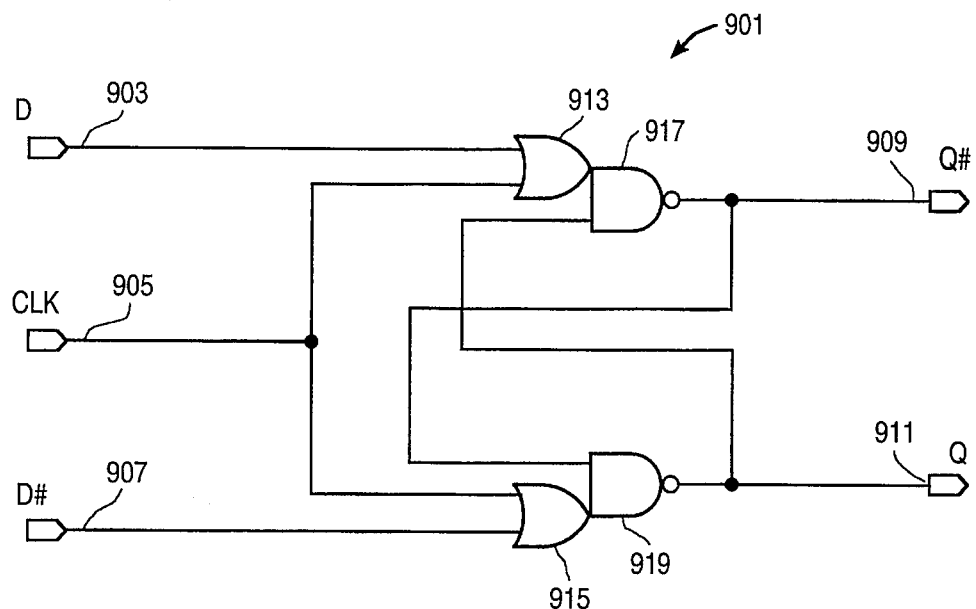
FIG_9
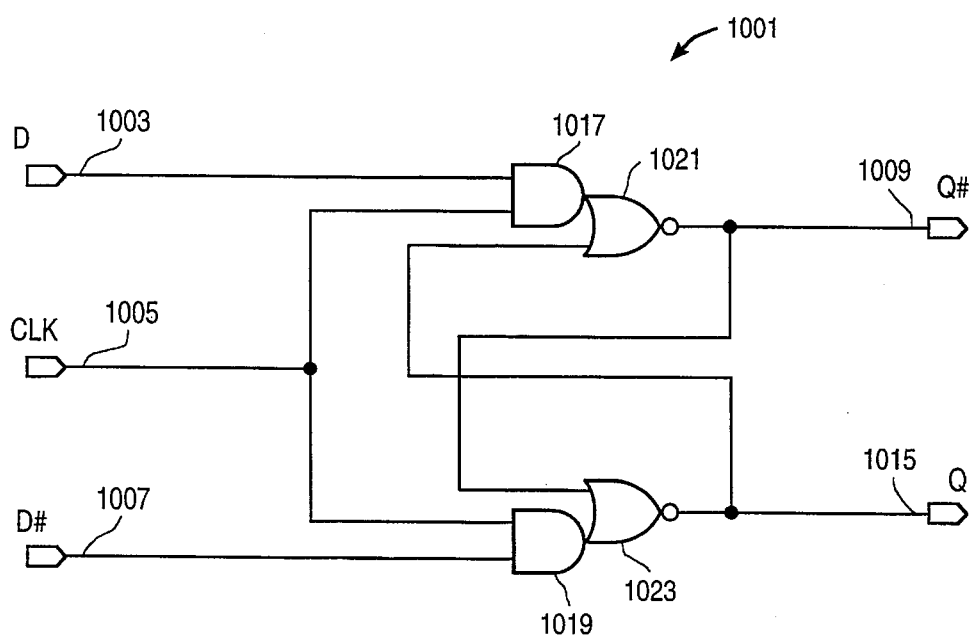
FIG_10

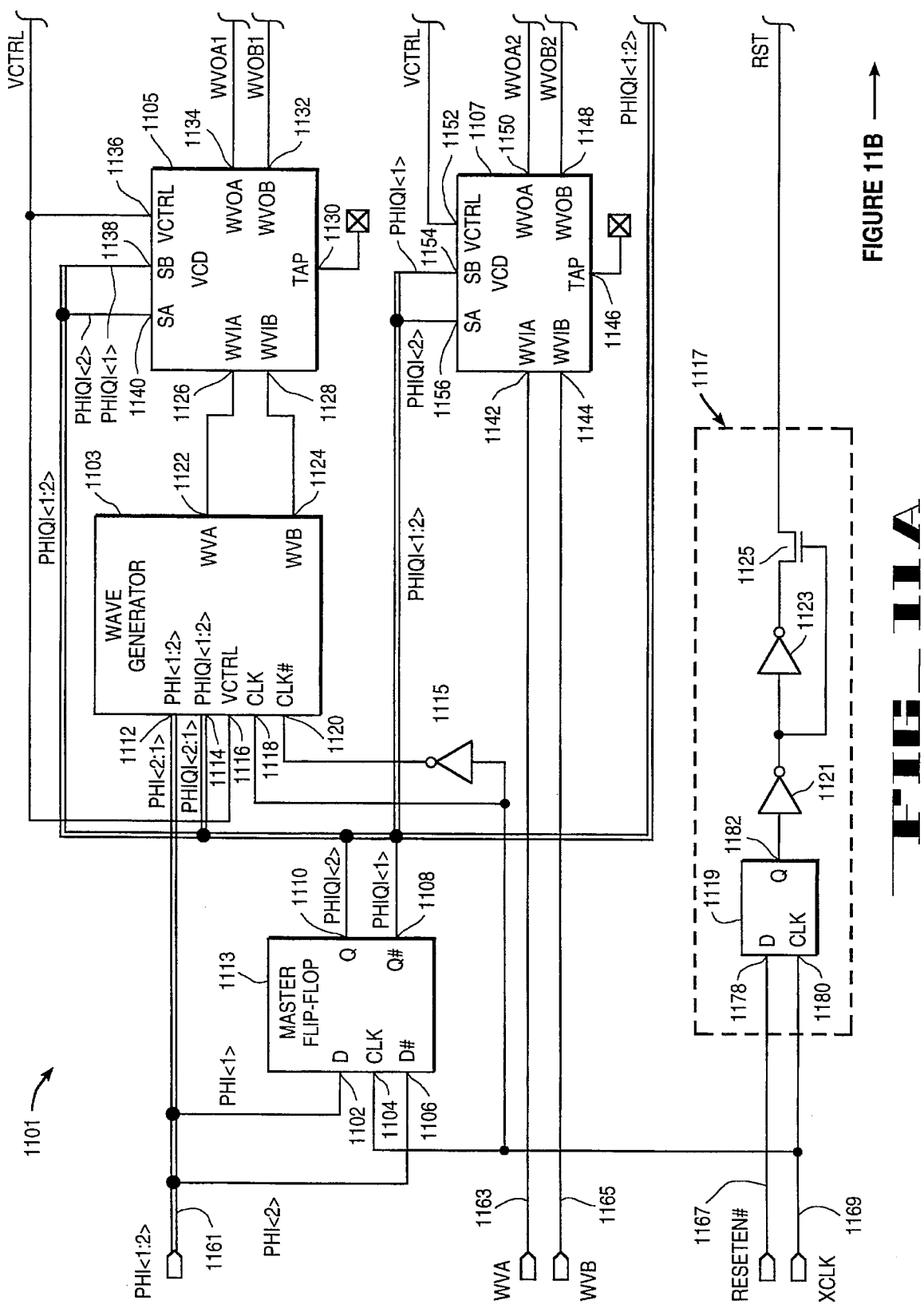
FIG. 11A    FIGURE 11B →

← FIGURE 11A

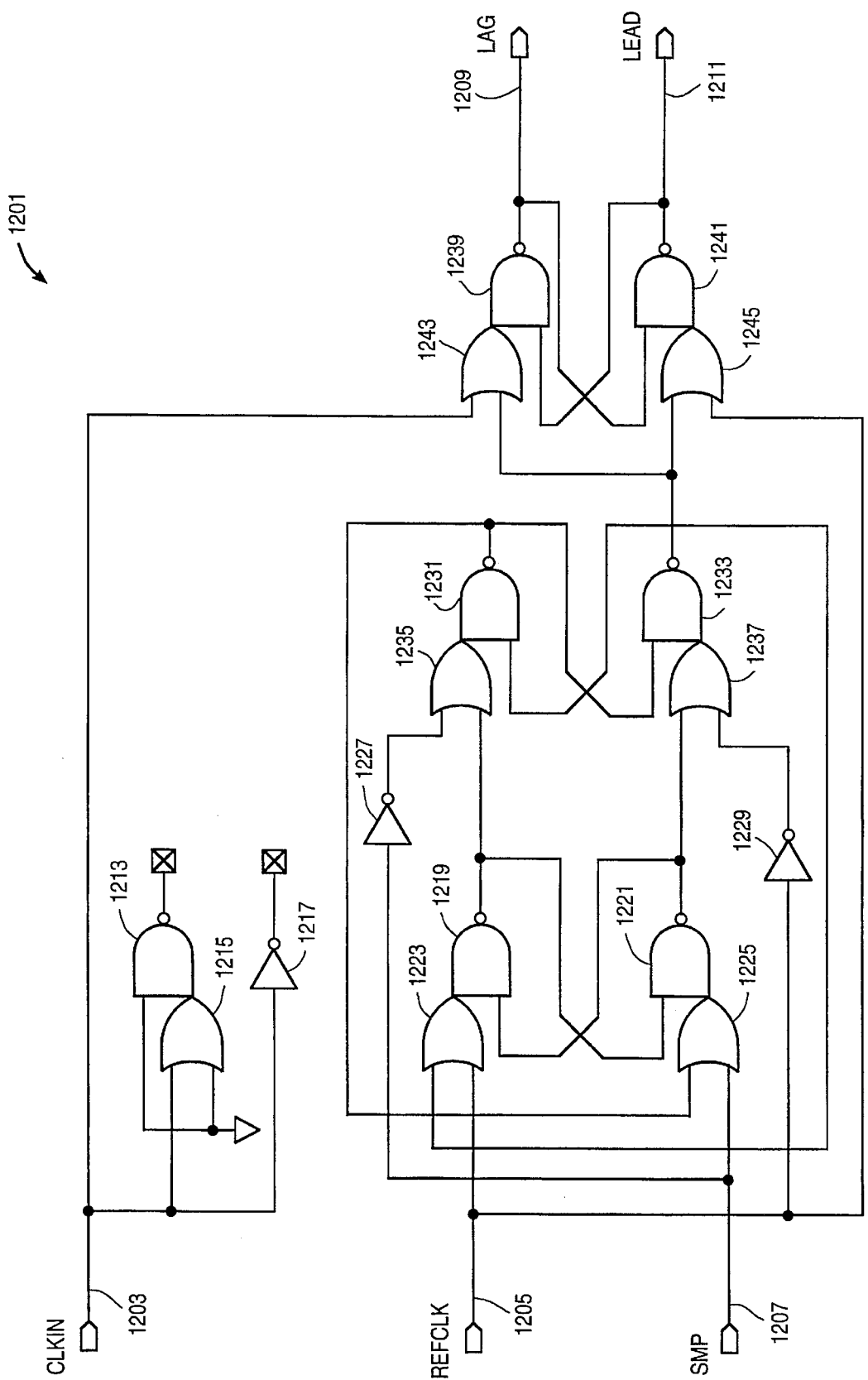
FIG_12

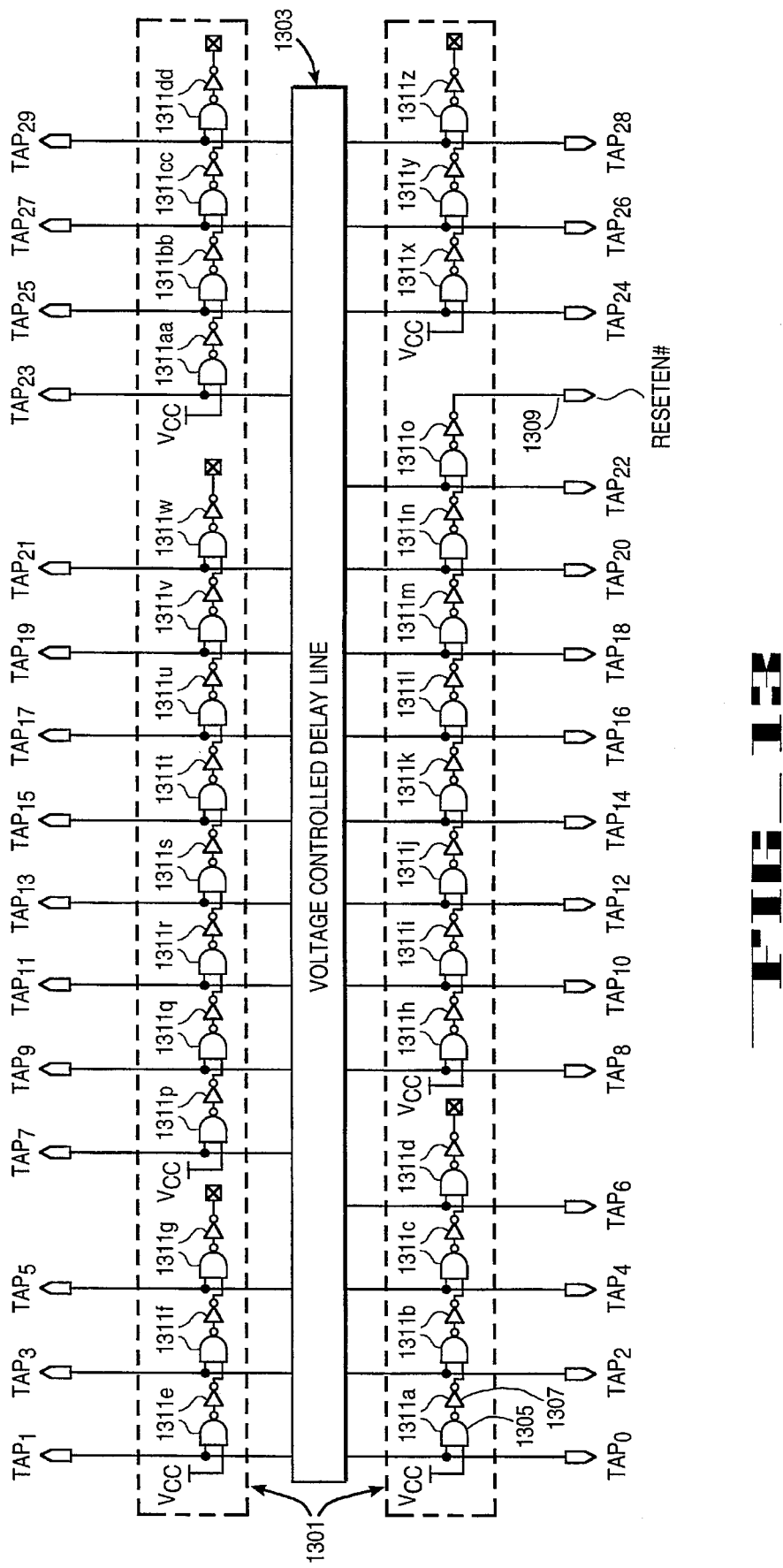
FIG_13

5,581,207

1
SYNCHRONOUS DELAY LINE

BACKGROUND OF THE INVENTION

1. Field of the Invention

This invention relates to the field of generating timing pulses having precise delays and, more particularly, to synchronous delay lines having high precision for use in metal-oxide semiconductor (MOS) circuits.

2. Related Application

This application is related to co-pending application Ser. No. 08/433,810, filed May 3, 1995, entitled "Phase Detector with Edge Sensitive Enable and Disable", and assigned to the Assignee of the present application.

In addition, this application is also related to co-pending application Ser. No. 394,174, filed Feb. 24, 1995, entitled "Delay Interpolation Circuitry", and assigned to the Assignee of the present application.

DESCRIPTION OF THE PRIOR ART

Integrated circuits having memory arrays as well as other similar circuits, generally require clock pulses or timing signals. The timing signals have a variety of uses such as latching address signals, decoding address signals, etc. The synchronous delay line (SDL) is a high resolution, multitiming reference. Its uses include generating precisely timed output signals for cache and DRAM controllers, generating critical internal timing pulses in cache memories, implementing clock and data recovery in data communication integrated circuits, and for digital waveform synthesis. Prior art techniques of implementing a synchronous delay line are described in U.S. Pat. No. 4,496,861 entitled "Integrated Circuitry Synchronous Delay Line", U.S. Pat. No. 4,975,605 entitled "Synchronous Delay Line with Automatic Reset", U.S. Pat. No. 4,994,695 entitled "Synchronous Delay Line with Quadrature Clock Phases", U.S. Pat. No. 5,365,128 entitled "High Resolution Synchronous Delay Line", and in an article entitled "A Novel Precision MOS Synchronous Delay Line", *IEEE Journal of Solid State Circuits*, Vol. SC-20, pp. 1265–71, December 1985. The above-listed prior art patents are assigned to the Assignee of the present application.

The synchronous delay line generates timing pulses at uniform, regular intervals between the start and end of a clock period. The timing pulses occur at evenly spaced intervals that are insensitive to variations in processing, $V_{CC}$, or temperature. The timing edges enable the triggering of logic operations in integrated circuits at any time with high resolution and precision.

One disadvantage with the prior art implementation of a synchronous delay line described in U.S. Pat. No. 5,365,128 is that skew may sometimes be created between the pair of internally generated complementary waveforms which enter the voltage controlled delay line (VCDL) of the SDL. Additional skew may also be created inside each individual voltage controlled delay element (VCD) of the VCDL and added to the skew entering the VCD. Thus, skew may build up between the two waveforms as they propagate through the VCDL. In order to reduce this problem, the phase generator, which generates the two complementary waveforms, must be adjusted carefully and precisely in order to minimize any skew between the two waveforms entering the VCDL.

2

In addition, the prior art sample and hold circuit of the SDL must also be adjusted carefully in order to minimize the delay error between the last tap and the first tap, also referred to as the wrap-around error. However, because of the skew present in the waveforms in prior art SDLs, precise adjustments to the prior art sample and hold circuits are imperfect.

Another problem with prior art SDLs involves the prior art phase generators which produce the internally generated complementary waveforms. The complementary waveforms produced by the prior art phase generators have different rise times than the regenerated waveforms subsequently produced by each VCD. As a result, the delay times between the last tap and the first tap, and the first tap to the second tap differ from the ideal value of $T_p/N$, where $T_p$ is the period of the reference clock and N is the number of taps in the SDL.

In view of the above described deficiencies in the prior art SDLs, an improved synchronous delay line is desired.

SUMMARY OF THE INVENTION

An improved synchronous delay line producing timing pulses having precise delays is described. In the present invention, a pair of complementary waveforms are received by a series of voltage controlled delay elements in a voltage controlled delay line. After a precise delay, the received pair of complementary waveforms are propagated through each of the voltage controlled delay elements. Included in each of the voltage controlled delay elements is propagation control circuitry which couples the propagation of the pair of waveforms through the voltage controlled delay element together. If a transition occurs on any one of the received pair of waveforms, the propagation control circuitry prevents the transition from propagating through the voltage controlled delay element until a corresponding transition occurs on the other one of the pair of waveforms. Once the corresponding waveform transitions are received on both waveforms and each waveform is therefore at the proper level, the propagation control circuitry allows each of the waveforms to propagate through the voltage controlled delay element. Thus, any skew that exists between the pair of waveforms when entering the voltage controlled delay element, for any reason, is removed by the propagation control circuitry. Accordingly, the present invention features an improved synchronous delay line having increased precision with minimal skew between the pair of complementary waveforms propagating through the synchronous delay line.

BRIEF DESCRIPTION OF THE DRAWINGS

FIGS. 1A and 1B are schematics of prior art voltage controlled delay elements.

FIG. 2 is a schematic of a prior art phase generator including a prior art wave generator.

FIG. 3 is a schematic of a prior art sample and hold circuit.

FIG. 4 is a block diagram of the presently preferred improved synchronous delay line.

FIGS. 5A and 5B are a block diagram of the presently preferred voltage controlled delay line.

FIG. 6 is a schematic of the presently preferred voltage controlled delay element.

FIG. 8 is a schematic of the presently preferred wave generator.

FIG. 9 is a schematic of the master flip-flop used in the present invention.

FIG. 10 is a schematic of the slave flip-flop used in the present invention.

FIGS. 11A and 11B are a block diagram of the presently preferred sample and hold circuit.

FIG. 12 is a schematic of the phase detector used in the present invention.

FIG. 13 is a block diagram of the polarity check circuit of the present invention.

DETAILED DESCRIPTION OF THE PRESENT INVENTION

Figure 5A:
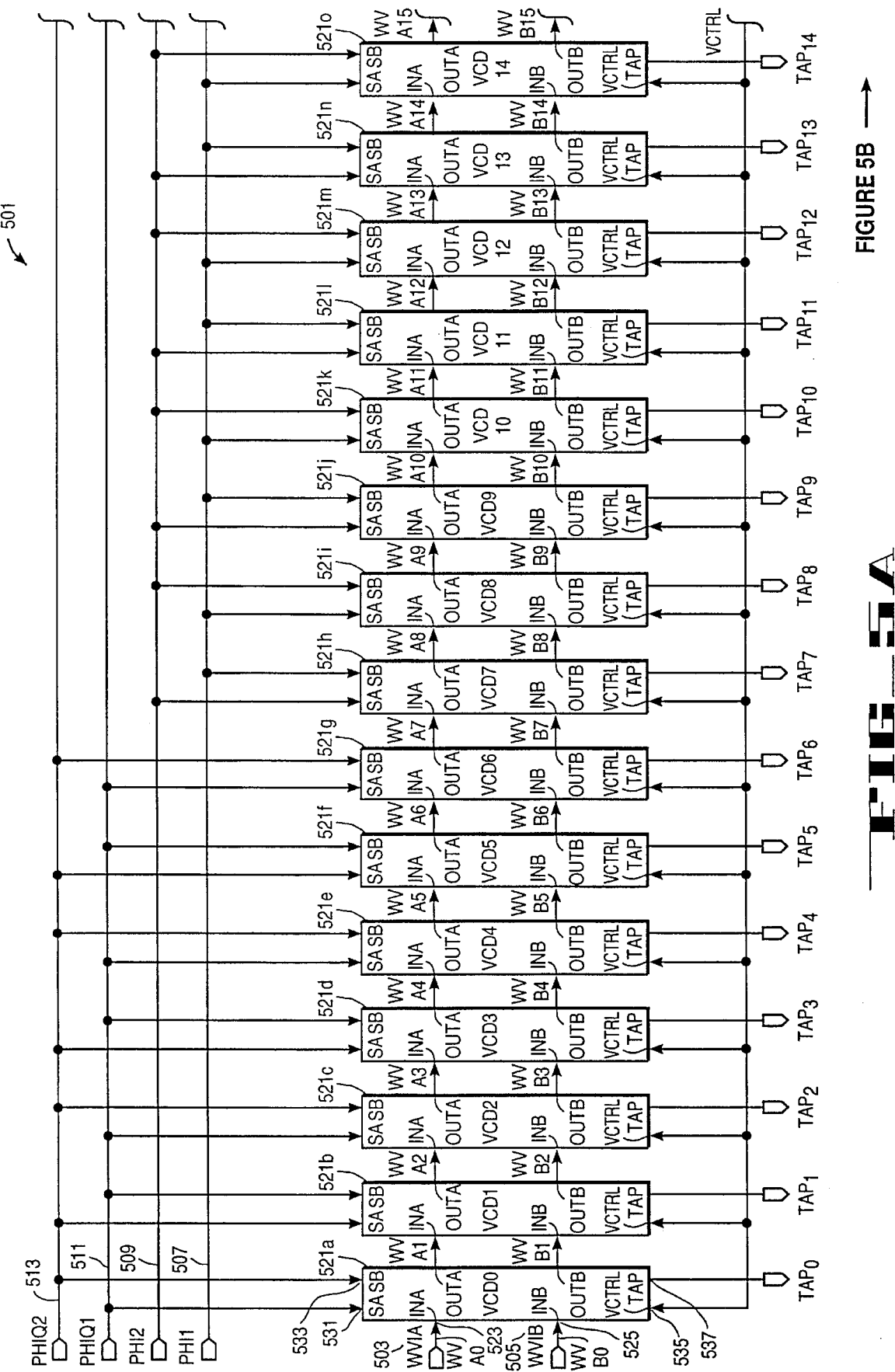

An improved synchronous delay line for generating precise timing pulses at selected intervals is described. In the following description numerous, specific details are set forth such as specific circuits, in order to provide a thorough understanding of the present invention. The present invention, however, may be practiced without these specific details. In other instances, the details of well-known circuitry are not shown here in order not to obscure the present invention unnecessarily.

FIG. 1A shows prior art VCD 101. Complementary input waveforms are received at terminals INA 107 and INB 109. The waveforms are received by cross-coupled logical-NAND gates 103 and 105, and are propagated to outputs OUTA 111 and OUTB 113. Capacitive loads 115 and 117 are connected to the outputs of cross-coupled logical-NAND gates 103 and 105 through transistors 127 and 129 in response to the VCTRL 119 signal. TAP output 125 is connected to OUTA 111 and OUTB 113 through transmission devices 131 and 133 in response to select signals SA 121 and SB 123.

A shortcoming of prior art VCD 101 is that the route of a waveform propagating through VCD 101 involves traveling through both logical-NAND gates 103 and 105. Accordingly, the minimal delay time between the taps of a synchronous delay line using prior art VCD 101 is limited to the propagation delay through the two gates, logical-NAND gates 103 and 105. As a result, the maximum number of taps that can be implemented in an SDL utilizing prior art VCD 101 is limited by the two gate delays attributed to logical-NAND gates 103 and 105.

FIG. 1B shows prior art VCD 151, which is a prior art implementation that is unable to remove skew between the complementary waveforms which enter the voltage controlled delay element. Prior art VCD 151 receives complementary input waveforms at INA 157 and INB 159. The input waveforms are propagated through prior art VCD 151 through inverters 153 and 155, and are output at terminals OUTA 161 and OUTB 163. Capacitive loads 165 and 167 are connected to the outputs of inverters 153 and 155 through transistors 177 and 179 in response to VCTRL 169. TAP output 175 is connected to outputs OUTA 161 and OUTB 163 through transmission devices 181 and 183 in response to the select signals SA 171 and SB 173.

Prior art VCD 151 solves the two gate delay limitation of prior art VCD 101. The waveform received at INA 157 only needs to propagate through one gate, namely inverter 153, to reach OUTA 161. Similarly, the waveform received at INB 159 only needs to propagate through one gate, namely inverter 155, to reach OUTB 163.

Prior art VCD 151 also does not address the problems associated with any skew which may exist between the two waveforms entering at INA 157 and INB 159. The waveforms received at these inputs propagate through VCD 151 completely independent of each other. Thus, all skew which exists between the complementary input waveforms propagates through VCD 151 and may even accumulate to unacceptable levels as the waveforms propagate through the voltage controlled delay line. As a consequence of the skew, overall synchronous delay line performance is reduced.

FIG. 2 shows a schematic of prior art phase generator 201. Prior art phase generator 201 produces complementary output waveforms WVA 205 and WVB 207 through pass network 203. Master-slave flip-flop pair 211 and 213 generate in-phase waveforms $PHI_1$ 215 and $PHI_2$ 217. Further, master-slave flip-flops 211 and 213 generate quadrature waveforms $PHIQ_1$ 218 and $PHIQ_2$ 219.

When compared with prior art VCDs, such as VCDs 101 and 151 described above, the loads of the complementary waveforms generated at WVA 205 and WVB 207 are not matched with the corresponding waveform outputs OUTA 111 and OUTB 113 on prior art VCD 101, or OUTA 161 and OUTB 163 on prior art VCD 151. The waveform outputs are loaded differently-the load supplied by pass network 203 in prior art phase generator 201 does not match the load provided by either prior art VCD 101 or 151. Thus, the complementary waveforms generated at WVA 205 and WVB 207 have different slopes than the waveforms generated at OUTA 111 and OUTB 113, or OUTA 161 and OUTB 163. Therefore, the waveforms propagating between the last tap and the first tap, and the first tap and the second tap of the SDL have different transition times. Accordingly, the delay times for these taps are imperfect as they differ from the ideal SDL value of $T_p/N$, where $T_p$ is the period of the reference clock, and N is the number of taps in the synchronous delay line.

FIG. 3 is a schematic of a prior art sample and hold circuit 301. Sample and hold 301 receives two complementary input waveforms WVA 303 and WVB 305. In response to non-overlapping in-phase waveform SPHI1 311 and SPHI2 313, and their complements $\overline{SPHI1}$ 315 and $\overline{SPHI2}$ 317, the waveforms received at WVA 303 and WVB 305 alter capacitors $C_{RA}$ 307 and $C_{RB}$ 309. In response to waveform pairs SPHI1 311 and SPHI2 313, and $\overline{SPHI1}$ 315 and $\overline{SPHI2}$ 317, $C_{CTRL}$ 319 is charged by $C_{RB}$ 309 while $C_{RA}$ 307 is charged by WVA 303. Similarly, $C_{CTRL}$ 319 is charged by $C_{RA}$ 307 while $C_{RB}$ 309 is charged by WVB 305. VCTRL 321 is output by $C_{CTRL}$ 319. In the event a reset is necessary, reset circuitry 325 pulls VCTRL low, or down to $V_{SS}$, in response to reset signal RST 323.

The output of sample and hold 301, VCTRL 321, is the analog voltage present at $C_{CTRL}$ 319. $C_{CTRL}$ 319 is charged by the analog voltages present at $C_{RA}$ 307 and $C_{RB}$ 309. As the synchronous delay line stabilizes, changes in the analog voltage at VCTRL 321 approach zero.

FIG. 4 is an overall block diagram of the presently preferred improved synchronous delay line 401. SDL 401 includes phase generator 403, voltage controlled delay line 405, sample and hold 407, polarity checker 409 and control capacitor 411. Phase generator 403 receives reference clock inputs XCLK 413 and XCLK# 415, and voltage control signal VCTRL 425. Phase generator 403 generates the two complementary output waveforms WVA 417 and WVB 419. For controlling voltage controlled delay line 405 tap outputs, TAP<0:N−1>431, phase generator 403 also produces two pairs of complementary clock phase signals, in-phase waveforms PHI<1:2>421, and quadrature waveforms PHIQ<1:2>423.

The in-phase waveforms PHI<1:2>421 are complementary to each other and in phase with the reference clock signal XCLK 413. Quadrature waveforms PHIQ<1:2>423 are complementary to each other and are shifted approximately 90 degrees with respect to the XCLK 413 signal and the inphase waveforms PHI<1:2>421.

Voltage controlled delay line 405 receives the two complementary waveforms WVA 417 and WVB 419 at WVIA 435 and WVIB 437. The inphase waveforms are received by voltage controlled delay line 405 at PHI<1:2>441, and the quadrature waveforms are received at PHIQ<1:2>439. The voltage control signal is received at VCTRL 443. Voltage controlled delay line 405 outputs propagated complementary waveforms at WVOA 427 and WVOB 429. N tap outputs are generated by voltage controlled delay line 405 at TAP<0:N−1>431.

Sample and hold 407 receives the propagated complementary waveforms from the voltage controlled delay line 405 at WVA 451 and WVB 449. The in-phase waveforms are received at PHI<1:2>453. A reset enable signal is received at RESETEN# 447 and a reference clock signal is received at XCLK 445. Sample and hold 407 generates the voltage control signal at VCTRL 457 which is received by phase generator 403, voltage controlled delay line 405, and control capacitor 411.

Polarity checker 409 receives at TAP<0:N−1>461 the N tap signals generated by the voltage controlled delay line 405. Polarity checker 409 generates a reset enable signal in response to the tap signals. The reset enable signal is output by polarity checker 409 at RESETEN# 459.

Synchronous delay line 401 produces an output voltage control signal at VCTRL 463. Further, the N output tap signals are output by the synchronous delay line 401 at TAP<0:N−1>465.

FIGS. 5A and 5B illustrate in block diagram form voltage controlled delay line 501 for the example of N equal to thirty. The two complementary input waveforms are received at WVIA 503 and WVIB 505. The two inphase waveforms are received at PHI1 507 and PHI2 509. The two quadrature waveforms are received at PHIQ1 511 and PHIQ2 513. The voltage control signal is received at VCTRL 515. The example of presently preferred voltage controlled delay line 501 comprises thirty serially coupled voltage controlled delay elements VCD0 521a through VCD29 521dd. It is appreciated that other embodiments of the present invention may feature a different number of VCD elements. Each VCD element 521 receives two input waveforms at INA 523 and IN B 525. The waveforms are then propagated through each VCD 521 and are generated at outputs OUTA 527 and OUTB 529. A tap output is generated by each VCD 521 at TAP 537. Each VCD 521 also receives a voltage control signal at VCTRL 535.

With the serial, or sequential, coupling of each VCD element 521a through 521dd, input waveforms received at WVIA 503 and WVIB 505 inputs of VCD0 521a travel in series through each VCD element, and are ultimately propagated to outputs WVOA 517 and WVOB 519 of VCD29 521dd. As the waveforms propagate through the VCDs 521a through 521dd, each of the corresponding tap elements of each VCD 521 produce corresponding timing pulses at tap outputs $TAP_0$ through $TAP_{29}$.

Each VCD 521 in voltage controlled delay line 501 receives two select signals SA 531 and SB 533. The select signals 531 and 533 are controlled by either PHI1 507 and PHI2 509, or PHIQ1 511 and PHIQ2 513.

In the example of presently preferred embodiment, the select signal inputs SA 531 and SB 533 of VCD elements VCD0 521a through VCD6 521g are controlled by the quadrature waveform pair PHIQ1 511 and PHIQ2 513. VCD7 521h through VCD22 521w are controlled by the in-phase waveform pair PHI1 507 and PHI2 509. Lastly, VCD elements VCD23 521x through VCD29 521dd are controlled by the quadrature waveform pair PHIQ1 511 and PHIQ2 513.

In the presently preferred embodiment, PHIQ1 511 is coupled to the SA 531 inputs of the even numbered VCDs 521, and to the SB 533 inputs of the odd numbered VCD 521 elements at the beginning of the voltage controlled delay line 501, VCD0 521a through VCD6 521g. Correspondingly, PHIQ2 513 is coupled to the SB 533 inputs of the even numbered voltage controlled delay elements 521 and to the SA 531 inputs of the odd numbered VCDs 521a through 521g at the beginning of the voltage controlled delay line 501.

In the middle of the voltage controlled delay line 501, VCD7 521h through VCD22 521w, PHI2 509 is coupled to the SA 531 inputs of the odd numbered VCD elements 521 and to the SB 533 inputs of the even numbered VCDs 521. PHI1 507 is connected to the SB 533 inputs of the odd numbered VCDs 521 and to the SA 531 inputs of the even numbered VCDs 521h through 521w.

At the end of the voltage controlled delay line 501, VCD23 521x through VCD29 521dd, PHIQ1 511 is connected to the SA 531 inputs of the odd numbered VCD elements 521 and to the SB 533 inputs of the even numbered VCD elements 521. PHIQ2 513 is connected to the SB 533 inputs of the odd numbered VCD elements 521 and to the SA 531 inputs of the even numbered VCDs 521x through 521dd.

The connections shown in FIGS. 5A and 5B between signals PHI1 507, PHI2 509, PHIQ1 511 and PHIQ2 513, and the select signal inputs, SA 531 and SB 533, of voltage controlled delay elements VCD0 531a through VCD29 521dd pertain to the presently preferred voltage controlled delay line which features thirty taps. However, if an alternate embodiment of voltage contolled delay line 501 featured a different number of taps, the rules for connecting signals PHI1 507, PHI2 509, PHIQ1 511 and PHIQ2 513, to the select signal inputs, SA 531 and SB 533, are as follows: the VCDs 521 would be grouped into first, second and third sections, the first section comprising the VCDs 521 at the beginning, the second section comprising the VCDs 521 in the middle, and the third section comprising the VCDs 521 at the end of the voltage controlled delay line 501.

In the first section, PHIQ1 511 is coupled to the SA 531 input and PHIQ2 513 is coupled to the SB 533 input of every other VCD 521 starting with the first VCD, while PHIQ1 511 is coupled to the SB 533 input and PHIQ2 513 is coupled to the SA 531 input of every other VCD 521 starting with the second VCD.

In the second section, if PHIQ2 513 was coupled to the SA 531 input of the last VCD in the first section, then PHI1 507 is coupled to the SA 531 input and PHI2 509 to the SB 533 input of every other VCD 521 starting with the first VCD of the second section, and PHI1 507 is coupled to the SB 533 input and PHI2 509 to the SA 531 input of every other VCD 521 starting with the second VCD of the second section. If, however, PHIQ1 511 was coupled to the SA 531 input of the last VCD of the first section, then PHI2 509 is coupled to the SA 531 input and PHI1 507 to the SB 533 input of every other VCD 521 starting the first VCD of the second section, and PHI2 509 is coupled to the SB 533 input and PHI1 507 is coupled to the SA 531 input of every other VCD 521 starting with the second VCD of the second section.

In the third section, if PHI1 507 was coupled to the SA 531 input of the last VCD of the second section, then PHIQ1 511 is coupled to the SA 531 input and PHIQ2 513 to the SB 533 input of every other VCD 521 starting with the first VCD of the third section, and PHIQ1 511 is coupled to the SB 533 input and PHIQ2 513 to the SA 531 input of every other VCD 521 starting with the second VCD of the second section. If, however, PHI2 509 was coupled to the SA 531 input of the last VCD of the second section, then PHIQ2 513 is coupled to the SA 531 input and PHIQ1 511 to the SB 533 input of every other VCD 521 starting the first VCD of the third section, and PHIQ2 513 is coupled to the SB 533 input and PHIQ1 513 is coupled to the SA 531 input of every other VCD 521 starting with the second VCD of the third section.

FIG. 6 is a schematic of the presently preferred voltage controlled delay element 601. VCD 601 receives two complementary input waveforms at WVIA 603 and WVIB 605. The input waveforms propagate through VCD 601 and are output at WVOA 607 and WVOB 609. Capacitive loads 617 and 619 are connected to the waveform paths through transistors 653 and 655 in response to the voltage control signal received at VCTRL 611. TAP output 617 alternates between being connected to WVOA 607 and WVOB 609 through transmission devices 621 and 623 in response to alternating complementary select signals SA 613 and SB 615.

The presently preferred embodiment of VCD 601 features propagation control circuitry 625. Propagation control circuitry 625 couples the propagation of the waveforms received at WVIA 603 and WVIB 605 to each other. In the presently preferred embodiment, the waveforms received at WVIA 603 and WVIB 605 are complements of each other. Therefore, under ideal conditions, all transitions which occur in the two waveforms should occur simultaneously. If, however, there is any skew between the two waveforms, transitions will not occur simultaneously.

Propagation control circuitry 625 of the present invention removes any skew which exists between the two waveforms entering at WVIA 603 and WVIB 605. The presently preferred embodiment of propagation control 625 includes a pair of four series connected devices which comprise p-type transistor 633 with its source coupled to $V_{CC}$ and its drain coupled to the source of p-type transistor 631. The drain of p-type transistor 631 is coupled to the drain of n-type transistor 629. The drain of n-type transistor 627 is coupled to the source of n-type transistor 629 and the source of n-type transistor 627 is coupled to $V_{SS}$. Propagation control circuitry 625 further comprises p-type transistor 641 with its source coupled to $V_{CC}$ and its drain coupled to the source of p-type transistor 639. The drain of p-type transistor 639 is coupled to the drain of n-type transistor 637. The source of n-type transistor 637 is coupled to the drain of n-type transistor 635. The source of n-type transistor 635 is coupled to $V_{SS}$.

The gate of p-type transistor 631 is coupled to the source of n-type transistor 637 and the gate of p-type transistor 639 is coupled to the source of n-type transistor 629. The gate of n-type transistor 629 is coupled to the source of p-type transistor 639 and the gate of n-type transistor 637 is coupled to the source of p-type transistor 631. The gates of p-type transistor 633 and n-type transistor 627 are coupled to WVIA 603. The gates of n-type transistor 635 and p-type transistor 641 are coupled to WVIB 605.

Operation of presently preferred propagation circuitry 625 is as follows: if an input waveform transition occurs on either WVIA 603 or WVIB 605 before the corresponding transition occurs on the other waveform input, propagation control circuitry 625 holds the propagation of the initially received waveform until the corresponding transition occurs on the other subsequently received waveform input. Propagation control circuitry 625 releases the received waveforms for propagation only after both inputs switch. Thus, the output waveforms at WVOA 607 and WVOB 609 both switch simultaneously only after both inputs have switched at WVIB 603 and WVIB 605. Therefore, any skew that is created for any reason between the two waveforms entering at WVIA 603 and WVIB 605 is removed immediately.

The interconnections between the pair of four series connected devices, 627,629,631 and 633, and 635,637,639 and 641, implement the coupling between the two waveforms entering the propagation control circuitry 625. The coupling between WVIA 603 and WVIB 605 involves the following interactions between them: in order for WVOA 607 to go high, both WVIA 603 must go low and WVIB 605 must go high. Conversely, in order for WVOA 607 to go low, both WVIA 603 must go high and WVIB 605 must go low. Similarly, in order for WVOB 609 to go high, both WVIB 605 must go low and WVIA 603 must go high. Finally, in order for WVOB 609 to go low, both WVIB 605 must go high and WVIA 603 must go low.

Assume, for example, that WVIA 603 is low and WVIB 605 is high, and that waveforms arrive at VCD 601 which cause WVIA 603 to go high and WVIB 605 to go low. When WVIA 603 goes high, n-type transistor 627 turns on, thereby pulling the drain of n-type transistor 627 low and turning on p-type transistor 639. When WVIB 605 goes low, p-type transistor 641 turns on thereby pulling the drain of p-type transistor 641 high and, in conjunction with p-type transistor 639, pulling WVOB 609 high. When the drain of p-type transistor 641 goes high, n-type transistor 629 turns on thereby, in conjunction with n-type transistor 627, pulling WVOA 607 low. Thus, the VCD 601 outputs, WVOA 607 and WVOB 609, switch only after both VCD inputs, WVIA 603 and WVIB 605, have switched. Since the VCD outputs switch together, the next VCD 601 receives deskewed inputs even if the present VCD 601 did not.

The presently preferred VCD 601 also includes dummy load 643 which comprises n-type transistor 645, p-type transistor 647, p-type transistor 649 and n-type transistor 651. The gate and source of n-type transistor 645 are coupled to $V_{SS}$, while the drain of n-type transistor 645 is coupled to WVQA 607. The gate and source of p-type transistor 647 are coupled to $V_{CC}$, while the drain of p-type transistor 647 is coupled to WVOA 607. The gate and source of p-type transistor 649 are coupled to $V_{CC}$, while the drain of p-type transistor 649 is coupled WVOB 609. The gate and source of n-type transistor 651 are coupled to $V_{SS}$ while the drain of n-type transistor 651 is coupled to WVOB 609. Dummy load 643 transistors 645, 647, 649, and 651 are coupled to the VCD 601 outputs, WVOA 607 and WVOB 609, in order to match the loads loading VCD 601 with the loads loading the wave generator, which will be discussed in detail below.

Figure 7:
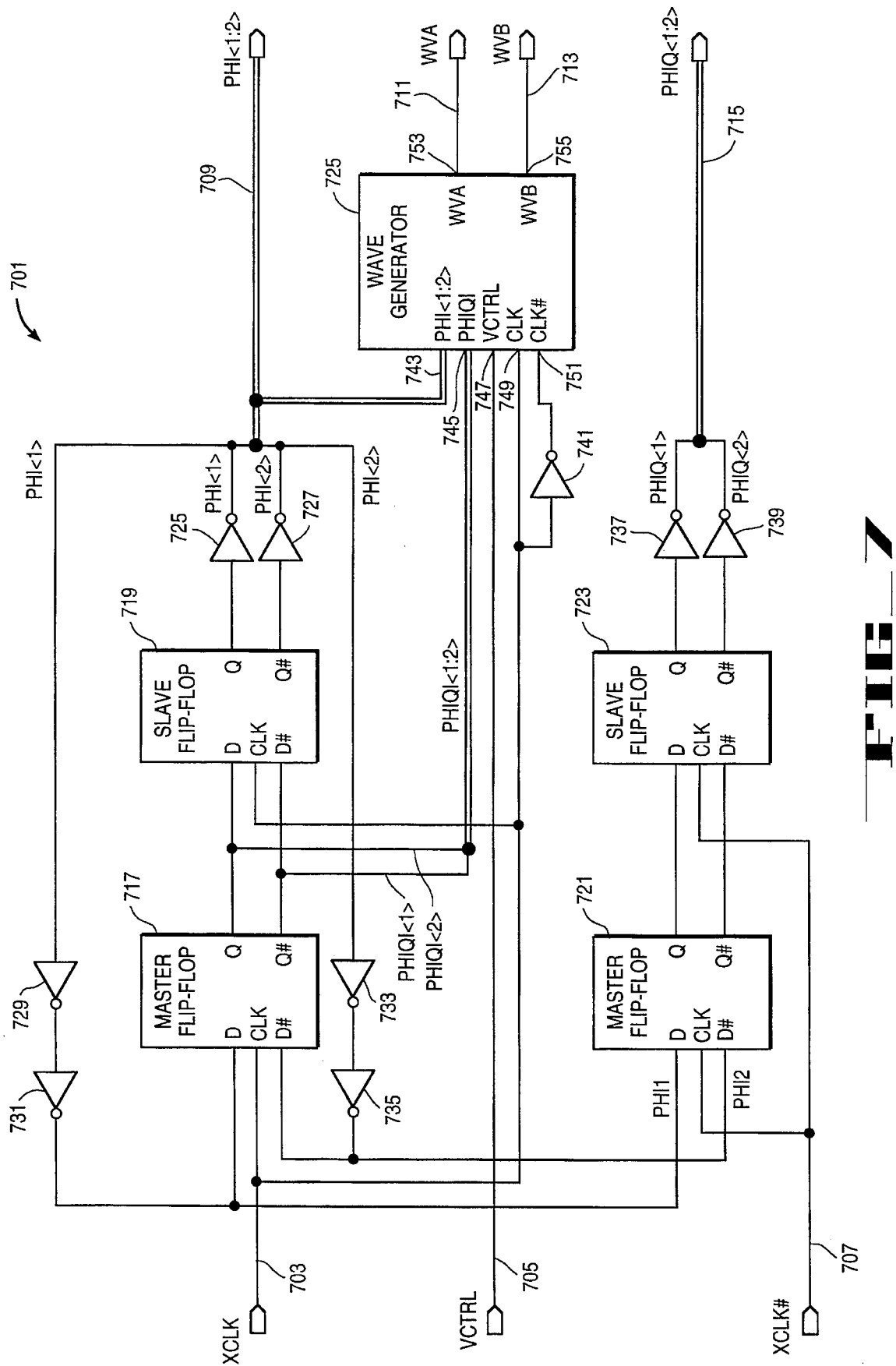
FIG. 7 is a block diagram of the presently preferred phase generator.

FIG. 7 shows a schematic of the presently preferred phase generator 701. Phase generator 701 receives the input reference clock signal XCLK 703 with master-slave flip-flop pair 717 and 719. Through inverters 725 and 727, in-phase waveforms PHI<1> and PHI<2> are generated by phase generator 701 at PHI<1:2>709. In-phase waveforms PHI<1> and PHI<2> are also received by wave generator 725 at PHI<1:2>743, and by master-slave flip-flop pair 721 and 723 after delay through inverters 729 and 731, and 733 and 735, respectively. XCLK# 707 is also received by master-slave flip-flop pair 721 and 723. Master-slave flip-flop pair 721 and 723 generate quadrature waveforms PHIQ<1> and PHIQ<2> through inverters 737 and 739, and are output by phase generator 701 at PHIQ<1:2>715. The use of in-phase waveforms PHI<1> and PHI<2> in conjunction with quadrature waveforms PHIQ<1> and PHIQ<2> is described in detail in U.S. Pat. No. 4,994,695 entitled "Synchronous Delay Line with Quadrature Clock Phases", which is assigned to the Assignee of the present application.

The presently preferred phase generator 701 includes wave generator 725 which receives in-phase waveforms at PHI<1:2>743 and quadrature waveforms PHIQI<1:2>745 generated by master-slave flip-flop pair 717 and 719. Wave generator 725 also receives a reference clock signal at CLK 749 and an inverted reference clock signal at CLK# 751 through inverter 741. Wave generator 725 generates two complementary output waveforms at WVA 753 and WVB 755 which are output by phase generator 701 at WVA 711 and WVB 713.

FIG. 8 is a schematic of the presently preferred wave generator 801. Wave generator 801 produces two complementary output waveforms at WVA 813 and WVB 815. Wave generator 801 also includes an inverted dummy TAP output 857 which is left unconnected. Dummy TAP 857 alternates between being connected to WVA 813 and WVB 815 through transmission devices 859 and 861 in response to quadrature waveforms PHIQI1 and PHIQI2.

Two in-phase waveforms, PHI<1> and PHI<2>, are received by wave generator 801 at PHI<1:2>803. Two quadrature waveforms, PHIQI<1> and PHIQI<2>, are received by wave generator 801 at PHIQI<1:2>805. Clock waveforms are received at CLK 811 and CLK# 809. The voltage control signal is received by wave generator 801 at VCTRL 807.

Like VCD 601, wave generator 801 also includes a pair of four series connected devices which serve as drivers and are similar to the transistors of propagation control circuitry 625 of VCD 601. The series connected devices include p-type transistor 821 with its source coupled to $V_{CC}$ and its drain coupled to the source of p-type transistor 823. The drain of p-type transistor 823 is coupled to the drain of n-type transistor 825. The source of n-type transistor 825 is coupled to the drain of n-type transistor 827. The source of n-type transistor 827 is coupled to $V_{SS}$. The source of p-type transistor 829 is coupled to V cc. The source of p-type transistor 829 is coupled to the source of p-type transistor 831. The drain of p-type transistor 831 is coupled to the drain of n-type transistor 833. The source of n-type transistor 833 is coupled to the drain of n-type transistor 835. The source of n-type transistor 835 is coupled to $V_{SS}$. The gates of p-type transistor 821 and n-type transistor 827 are coupled to quadrature waveform PHIQI<2>. The gates of p-type transistor 829 and n-type transistor 835 are coupled to quadrature waveform PHIQI<1>. The gates of n-type transistor 825 and n-type transistor 833 are coupled to CLK 811. The gates of p-type transistor 823 and p-type transistor 831 are coupled to CLK# 809.

Wave generator 801 output WVA 813 is coupled to the drain of p-type transistor 823. Output WVB 815 is coupled to the drain of p-type transistor 831. Output WVA 813 is loaded by capacitive load 817 through n-type transistor 845 in response to the voltage control signal received by the wave generator 801 at the VCTRL 807. Similarly, output WVB 815 is loaded by capacitive load 819 through n-type transistor 847 in response to the voltage control signal received at VCTRL 807.

Capacitive loads 817 and 819 of present wave generator 801 are replicas of, and correspond with, capacitive loads 617 and 619 of present voltage controlled delay element 601. With corresponding capacitive loads 817 and 819, wave generator 801 outputs WVA 813 and WVB 815 are loaded similarly to outputs WVOA 607 and WVOB 609 of voltage controlled delay element 601. With this improvement over prior art wave generator 201, WVA 813 and WVB 815 output transitions are matched with the output transitions of WVOA 607 and WVOB 609. The uniform waveform transitions provide the present synchronous delay line with increased precision.

Wave generator 801 output WVA 813 is also coupled to the drains of n-type transistor 849 and p-type transistor 851. The sources of n-type transistor 849 and p-type transistor 851 are coupled to the first in-phase waveform PHI<1>. The gate of n-type transistor 849 is coupled to CLK# 809 and the gate of p-type transistor 851 is coupled to CLK 811.

Similarly, output WVB 815 is coupled to the drains of n-type transistor 855 and p-type transistor 853. The sources of n-type transistor 855 and t-type transistor 853 are coupled to the second in-phase waveform PHI<2>. The gate of p-type transistor 853 is coupled to CLK 811 and the gate of n-type transistor 855 is coupled to CLK# 809.

Wave generator 801 also includes n-type transistors 837 and 841, and p-type transistors 839 and 843. The sources and drains of both n-type transistors 837 and 841 are coupled to $V_{SS}$. Conversely, the drains and sources of p-type transistors 839 and 843 are coupled to $V_{CC}$. The gate of n-type transistor 837 is coupled to the drain of p-type transistor 821. The gate of n-type transistor 841 is coupled to the drain of p-type transistor 829. The gate of p-type transistor 839 is coupled to the source of n-type transistor 825. The gate of p-type transistor 843 is coupled to the source of n-type transistor 833.

Transistors 837, 839, 841 and 843 are capacitive dummy loads which load the pair of four series connected devices in wave generator 801 the same as their counterparts in propagation control circuitry 625 of VCD 601. In particular, n-type transistor 837 loads the drain of p-type transistor 821 the same as n-type transistor 637 loads the drain of p-type transistor 633 of propagation control circuitry 625. P-type transistor 839 loads the source of n-type transistor 825 the same as p-type transistor 639 loads the source of n-type transistor 629. N-type transistor 841 loads the drain of p-type transistor 829 the same as n-type transistor 629 loads the drain of p-type transistor 641. P-type transistor 843 loads the source of n-type transistor 833 the same as p-type transistor 631 loads the source of n-type transistor 637. Accordingly, transistors 837, 839, 841, and 843 of wave generator 801 correspond with propagation control circuitry 625 transistors 637, 639, 629, and 631, respectively.

Wave generator 801 outputs WVA 813 and WVB 815 are based on inputs received at CLK 811, CLK# 809, PHI<1:2>803, and PHIQI<1:2>805.

When CLK 811 goes high and CLK# 809 goes low, transistors 823, 825, 831, and 833 are all switched on. Accordingly, the output WVA 813 switches to the complement of the logic level of PHIQI<2>, while the output WVB 815 switches to the complement of the logic level of PHIQI<1>. If PHIQI<1> is high and PHIQI<2> is low, then transistors 821 and 835 are switched on and transistors 827 and 829 are switched off. Thus, output WVA 813 is coupled to $V_{CC}$, for high, and output WVB 815 is coupled to $V_{SS}$, or low. Conversely, if PHIQI<1> is low and PHIQI<2> is high, then transistors 821 and 835 are switched off and transistors 827 and 829 are switched on. In this case, output WVA 813 is coupled to $V_{SS}$, or low, and output WVB 815 is coupled to $V_{CC}$, or high.

When CLK 811 goes low and CLK# 809 goes high, devices 823, 825, 831, and 833 are all switched off. In order to prevent WVA 813 and WVB 815 from floating when devices 823, 825, 831 and 833 are switched off, two active networks comprising device pairs 849 and 851, and 853 and 855, turn on and maintain the logic levels on WVA 813 and WVB 815 while CLK 811 and CLK# 809 are inactive. These logic levels are coupled from PHI<1> to WVA 813 through devices 849 and 851, and from PHI<2> to WVB 815 through devices 853 and 855, respectively. The transistors of dummy load 643 of VCD 601 are replicas of, and correspond with, transistors 849, 851, 853, and 855. Dummy load 643 loads VCD 601 outputs WVOA 607 and WVOB 609 the same as wave generator output WVA 813 and WVB 815 are loaded by transistors 849, 851, 853, and 855 during the time CLK 811 and CLK# 809 are active.

As described above, wave generator 801 outputs WVA 813 and WVB 815 are similarly capacitively loaded and driven as VCD 601 outputs WVOA 607 and WVOB 609. As a result, output waves produced at WVOA 607, WVOB 609, WVA 813, and WVB 815 have the same transition times. Therefore, waveforms output by wave generator 801 have the same slope as waveforms output by all of the VCDs 521a through 521dd of voltage controlled delay line 501. As a result, the delay of $TAP_0$ of VCD0 521a, which is derived from the waveforms input to VCD0 521a from wave generator 801, is matched better than in the prior art to the taps immediately preceding and following, i.e., to $TAP_{29}$ of VCD29 521dd and $TAP_1$ of VCD1 521b.

FIG. 9 is a schematic of the master flip-flop 901 utilized by the present invention. Master flip-flop 901 includes cross-coupled logical-NAND gates 917 and 919. Logical-NAND gate 917 receives the output from logical-OR gate 913. Logical-NAND gate 919 receives the output from logical-OR gate 915. D input 903 is coupled to an input of logical-OR gate 913, and the D# 907 input is coupled to an input of logical-OR gate 915. Clock input CLK 905 is coupled to inputs of both logical-OR gates 913 and 915. Output Q# 909 is the output of logical-NAND gate 917, and output Q 911 is the output of logical-NAND gate 919.

FIG. 10 is a schematic of the presently preferred slave flip-flop 1001 utilized by the present invention. Slave flip-flop 1001 comprises cross-coupled logical-NOR gates 1021 and 1023, and logical-AND gates 1017 and 1019. The output of logical-AND gate 1017 is coupled to an input of logical-NOR gate 1021. The output of logical-AND gate 1019 is coupled to an input of logical-NOR gate 1023. Input D 1003 is coupled to an input of logical-AND gate 1017 and input D# is coupled to an input of logical-AND gate 1019. Clock input CLK 1005 is coupled to inputs of logical-AND gates 1017 and 1019. Slave flip-flop 1001 output Q# 1009 is the output of logical-NOR gate 1021, and output Q 1015 is the output of logical-NOR gate 1023.

Figure 11B:
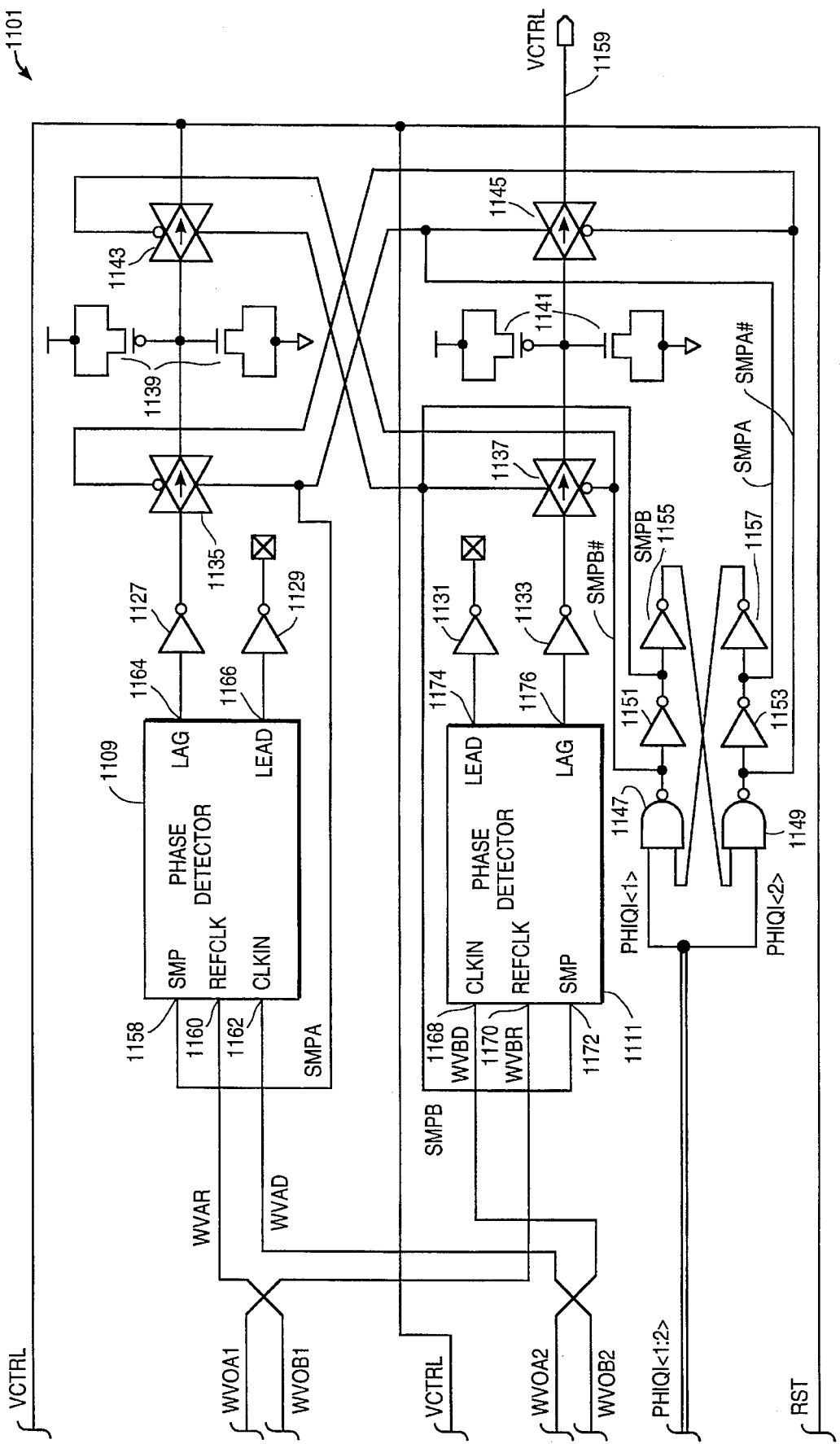

FIGS. 11A and 11B show the presently preferred sample and hold circuit 1101 in block diagram form. The presently preferred sample and hold circuit 1101 has several improvements made to it over prior art sample and hold 301 in order to increase the sampling precision and, as a result, the wrap-around delay precision, i.e., delay from the last tap to the first tap.

As shown in FIGS. 11A and 11B, sample and hold 1101 receives two in-phase waveforms at PHI<1:2>1161. Two propagated complementary input waveforms are received at WVA 1163 and WVB 1165. The reset enable signal is received at RESETEN# 1167 and the reference clock signal is received at XCLK 1169. Sample and hold 1101 includes master flip-flop 1113 which receives in-phase waveform PHI<1> at D input 1102, and in-phase waveform PHI<2> at D# 1106. Master flip-flop 1113 receives a reference clock signal from XCLK 1169 at CLK 1104. Master flip-flop 1113 generates two internal quadrature waveforms, PHIQI<1> and PHIQI<2>, at Q# 1108 and Q 1110, respectively.

Wave generator 1103 of sample and hold 1101, which is an exact copy of wave generator 725 in phase generator 701 of FIG. 7, receives the two in-phase waveforms PHI<1> and PHI<2> as well as the two internal quadrature waveforms PHIQI<1> and PHIQI<2>. The two in-phase waveforms are received at PHI<1:2>1112 and the two internal quadrature waveforms are received at PHIQI<1:2>1114. In contrast to wave generator 725 in phase generator 701 of FIG. 7, where the PHI<1> signal is coupled to the PHI<1> input, the PHI<2> signal is coupled to the PHI<2> input, the PHIQI<1> signal is coupled to the PHIQI<1> input, and the PHIQI<2> signal is coupled to the PHIQI<2> input, in wave generator 1103 of sample and hold 1101 these signals are swapped: the PHI<1> signal is coupled to the PHI<2> input, the PHI<2> signal is coupled to the PHI<1> input, the PHIQI<1> signal is coupled to the PHIQI<2> input and the PHIQI<2> signal is coupled to the PHIQI<1> input. Wave generator 1103 receives the clock signal at CLK 1118 and an inverted clock signal through inverter 1115 at CLK# 1120. The voltage control signal is received at VCTRL 1116. Two complementary output waveforms are produced by wave generator 1103 at WVA 1122 and WVB 1124.

The two complementary waveforms output by wave generator 1103 are received by VCD 1105 at WVIA 1126 and WVI B 1128. VCD 1105 uses the two internal quadrature waveforms as select signals. PHIQI<2> is coupled to SA 1140, and PHIQI<1> is coupled to SB 1138. VCD 1105 receives the voltage control signal at VCTRL 1136. VCD 1105 propagates the two input waveforms received and generates complementary output waveforms WVOA1 and WVOB1 at WVOA 1134 and WVOB 1132, respectively. TAP output 1130 is left unconnected.

Sample and hold 1101 also includes a second VCD 1107 which receives the two complementary input waveforms propagated from the voltage controlled delay line received by sample and hold 1101 at WVA 1163 and WVB 1165. WVA is received at WVIA 1142, and WVB is received at WVIB 1144. Internal quadrature waveform PHIQI<2> is received at SA 1156, and internal quadrature waveform PHIQI<1> is received SB 1154. The voltage control signal is received at VCTRL 1152. VCD 1107 propagates the two received waveforms as WVOA2 and WVOB2 at WVOA 1150 and WVOB 1148, respectively. TAP output 1146 is left unconnected.

The voltage controlled delay line output waveforms, which are received at WVA 1163 and WVB 1165, are loaded by VCD 1107 in order that they be delayed by exactly $T_p$ (when the synchronous delay line is in this steady state) with respect to the inputs to the first VCD element VCD0 521a. Since the PHI<1:2>1112 and PHIQI<1:2>1114 inputs to wave generator 1103 are inverted with respect to the PHI<1:2>743 and PHIQI<1:2>745 inputs to wave generator 725, wave generator 1103 outputs WVA 1122 and WVB 1124 are effectively delayed by one clock period from wave generator 725 outputs WVA 753 and WVB 755. This means that sample and hold 1101 inputs WVA 1163 and WVB 1165, which are delayed by one clock period in steady-state operation with respect to wave generator 725 outputs WVA 753 and WVB 755, will be exactly aligned with wave generator 1103 outputs WVA 1122 and WVB 1124, respectively, in the steady-state.

Sample and hold 1101 includes two phase detectors 1109 and 1111 which compare the two pairs of waveforms output by VCDs 1105 and 1107. The waveforms output by VCD 1105 are referred to as the reference waveforms, and the waveforms output by VCD 1107 are referred to as the delayed waveforms. Thus, WVAR corresponds with WVOB1, WVBR corresponds with WVOA 1, WVAD corresponds with WVOB2 and WVBD corresponds with WVOA2. In steady-state operation WVAR and WVAD will be perfectly aligned, as will WVBR and WVBD.

Phase detector 1109 receives WVAR at REFCLK 1160 and WVAD at CLKIN 1162. A sample enable signal SMPA is received by phase detector 1109 at SMP 1158. Lag and lead outputs are generated at LAG 1164 and LEAD 1166. LEAD 1166 is coupled to inverter 1129 whose output is left unconnected. LAG 1164 is coupled to inverter 1127 whose output is coupled to transmission device 1135.

Phase detector 1111 receives WVBD at CLKIN 1168, and WVBR at REFCLK 1170. Sample enable signal, SMPB, is received by phase detector 1111 at SMP 1172. Lead and lag outputs are generated by phase detector 1111 at LEAD 1174 and LAG 1176. LEAD 1174 is coupled to inverter 1131 whose output is left unconnected. LAG 1176 is coupled to inverter 1133 whose output is coupled to transmission device 1137.

The output of transmission device 1135 is coupled to capacitive load 1139 and the input of transmission device 1143. The output of transmission device 1143 is coupled to output VCTRL 1159. The output of transmission device 1137 is coupled to capacitive load 1141 and the input of transmission device 1145. The output of transmission device 1145 is also coupled to output VCTRL 1159.

Logic gates 1147, 1149, 1151, 1153, 1155, and 1157 produce enable signals SMPA, SMPA#, SMPB, and SMPB# . These enable signals are used to activate phase detectors 1109 and 1111 and transmission devices 1135, 1137, 1143, and 1145. Signals SMPA and SMPA# only go active after both signals SMPB and SMPB# go inactive. Likewise, signals SMPB and SMPB# only go active after both signals SMPA and SMPA# go inactive.

Logical-NAND gate 1147 receives PHIQI<1> and the output of inverter 1157. Logical-NAND gate 1149 receives PHIQI<2> and the output of inverter of 1155. Logical-NAND gate 1147 generates SMPB# , and logical-NAND gate 1149 generates SMPA# . SMPB# is received by inverter 1151 which produces SMPB. SMPA# is received by inverter 1153 which generates SMPA. Inverter 1155 receives SMPB, and the output of inverter 1155 is fed back to logical-NAND gate 1149. Inverter 1157 receives SMPA, and the output of inverter 1157 is fed back to logical-NAND gate 1147. Logical-NAND gate 1147 assures that signals SMPB and SMPB# do not go active until signals SMPA and SMPA# go inactive. Likewise, logical-NAND gate 1149 assures that signals SMPA and SMPA# do not go active until signals SMPB and SMPB# go inactive.

When SMPA goes high and SMPB goes low, transmission devices 1135 and 1145 are activated and transmission devices 1137 and 1143 are deactivated. In addition, the rising edge of SMPA enables phase detector 1109 to detect any phase differences between WVAR and WVAD. Capacitive load 1139 is connected to the LAG 1164 output of phase detector 1109 through inverter 1127. Output VCTRL 1159 is connected to capacitive load 1141. On the other hand, when SMPB goes high and SMPA goes low, transmission devices 1135 and 1145 are switched off and transmission devices 1137 and 1143 are switched on. In addition, the rising edge of SMPB will activate phase detector 1111 to detect any phase differences between WVBD and WVBR. Capacitive load 1141 is connected to the LAG 1176 output of phase detector 1111 through inverter 1133. VCTRL 1159 is connected to capacitive load 1139.

With the alternating SMPA and SMPB enable signals, VCTRL 1159 alternates between being connected to either capacitive load 1139 or 1141. While VCTRL is connected to one of the capacitive loads 1139 or 1141, the other one of the capacitive loads is charged or discharged by the inverted LAG output of either phase detector 1109 or 1111 depending on the phase difference between the phase detector inputs. Since capacitive loads 1139 and 1141 are much smaller than the control capacitor 1401 of FIG. 14, corrections to VCTRL due to phase differences are very small. In other words, VCTRL changes with a very long time constant. In steady-state operation, a small ripple appears on VCTRL caused by the correction to VCTRL. While small, it is, nevertheless, independent of phase differences, i.e., the correction does not get smaller for smaller phase differences. Thus, small phase differences are "over corrected" continuously resulting in a small ripple on VCTRL and small jitter on the tap outputs. By increasing the ratio of control capacitor 1401 to capacitive loads 1139 and 1141, this jitter can be reduced to a negligible value.

Sample and hold 1101 reset circuitry 1117 includes D flip-flop 1119 which receives RESETEN# 1167 at input D 1178. XCLK input 1169 is received by D flip-flop 1119 at CLK 1180. D flip-flop 1119 output Q 1182 is coupled to inverter 1121 whose output is coupled to inverter 1123 and the gate of n-type transistor 1125. When n-type transistor 1125 is activated, the output of inverter 1123 is connected to output VCTRL. Accordingly, when reset circuit 1117 is enabled, VCTRL is pulled low, or down to $V_{SS}$, by inverter 1123. By connecting the source of transistor 1125 to inverter 1123 rather than to $V_{SS}$, its noise margin is greatly increased: when reset circuit 1117 is disabled, small noise on the gate of 1125 has no effect, while were the source of 1125 connected to $V_{SS}$, small noise on the gate of 1125 would discharge VCTRL partially thereby creating large delay errors on the tap outputs.

Reference signals WVAR and WVBR, which are output by VCD 1105 are inverted replicas of the output waveforms from the first VCD, VCD 521a of FIG. 5A. The replicated waveforms are complemented in order to account for the delay of $T_p$ through the voltage controlled delay line 501. The replicated waveforms, WVAR and WVBR, are obtained by generating the reference waveforms from a copy of the wave generator (wave generator 1103) and a voltage controlled delay element (VCD 1105). In order to invert the waveforms, the wave generator connections to the in-phase and quadrature waveforms, PHI<1:2> and PHIQI<1:2>, are reversed, as shown in FIG. 11A at wave generator 1103 inputs 1112 and 1114.

While the synchronous delay line is in steady state, WVAR and WVAD are precisely aligned with each other as are WVBR with WVBD. Phase detectors 1109 and 1111 are used to compare WVAR with WVAD, and WVBR with WVBD. If WVAD goes high before WVAR, i.e., WVAD leads WVAR, the LAG 1164 output of phase detector 1109 generates a low level signal which is sampled, after inverter 1127, as a high voltage level on to capacitive load 1139. Similarly, if WVBD goes high before WVBR, i.e., WVBD leads WVBR, phase detector 1111 generates a low level signal on output LAG 1176 which is sampled, after inverter 1133, as a high voltage level on to capacitive load 1141. Phase detectors 1109 and 1111 detect even the smallest phase differences between WVAR and WVAD, and between WVBR and WVBD.

Unlike prior art sample and hold 301, only two voltage levels are sampled on to capacitive loads 1139 and 1141—$V_{SS}$ or $V_{CC}$. In prior art sample and hold 301, a continuum of voltage values is sampled. Thus, phase detectors 1109 and 1111 effectively increase the presently preferred synchronous delay line open loop gain to infinity. As a consequence, the present synchronous delay line is always unstable so that VCTRL 1159 oscillates thereby causing jitter to appear at TAP outputs 431 of voltage controlled delay line 405. The jitter is smallest for the first tap, $TAP_O$ of VCD0 521a, and the jitter increases to a maximum value for the last tap, $TAP_{29}$ of VCD29 521dd. The jitter is reduced to a negligible value by selecting a very high value for control capacitor 411 with respect to capacitance loads 1139 and 1141.

FIG. 12 is a schematic of the phase detector 1201 utilized by the sample and hold 1101 of the present invention. Phase detector 1201 includes cross-coupled logical-NAND gates 1219 and 1221. Logical-NAND gate 1219 receives the output of logical-OR gate 1223, and logical-NAND gate 1221 receives the output of logical-OR gate 1225. Logical-OR gate 1223 receives an input from REFCLK 1205, and logical-OR gate 1225 receives an input from SMP 1207. Logical-NAND gate 1219 output is received by logical-OR gate 1235, and logical-NAND gate 1221 output is received by logical-OR gate 1237. Logical-OR gate 1235 receives an inverted SMP 1207 signal through inverter 1227, and logical-OR gate 1237 receives an inverted REFCLK 1205 signal through inverter 1229. Logical-OR gate 1235 output is received by logical-NAND gate 1231, and logical-OR gate 1237 output is received by logical-NAND gate 1233. Logic gates 1231 and 1233 are cross-coupled logical-NAND gates. The output of logical-NAND gate 1231 is also coupled to an input of logical-OR gate 1225, and the output of logical-NAND gate 1233 is also coupled to an input of logical-OR gate 1223. The output of logical-NAND gate 1233 is received by logical-OR gates 1243 and 1245. Logical-OR gate 1243 also receives clock signal CLKIN 1203 and logical-OR gate 1245 also receives reference clock signal REFCLK 1205. The outputs of logical-OR gates 1243 and 1245 are coupled to inputs of cross-coupled logical-NAND gates 1239 and 1241, respectively.

Logic gates 1213, 1215 and 1217 form a capacitive dummy load on clock input CLKIN 1203. Gates 1213, 1215 and 1217 load CLKIN 1203 and are replicas of the load on REFCLK 1205 supplied by gates 1219, 1223 and 1229 during a low to high level transition on REFCLK 1205. The input of inverter 1217 is coupled to CLKIN 1203 and the output of inverter 1217 is left unconnected. Logical-OR gate 1215 receives an input from CLKIN 1203, and another input of logical-OR gate 1215 is coupled to $V_{SS}$. The output of logical-OR gate 1215 is coupled to an input of logical-NAND gate 1213. The other input of logical-NAND gate 1213 is coupled to $V_{SS}$. The output of logical-NAND gate 1213 is left unconnected. Output LAG 1209 is coupled to the output of logical-NAND gate 1239 and output LEAD 1211 is coupled to the output of logical-NAND gate 1241.

Phase detector 1201 is an edge sensitive phase detector which generates lag and lead outputs at LAG 1209 and LEAD 1211 in response to level transitions, or edges, which occur at inputs CLKIN 1203, REFCLK 1205 and SMP 1207. Clock inputs are received at CLKIN 1203 and REFCLK 1205 and an enable check signal is received at SMP 1207.

Phase detector 1201 is an edge triggered phase detector which is described in detail in co-pending application Ser. No. 08/433,810, filed May 3, 1995, entitled "Phase Detector with Edge Sensitive Enable and Disable", and assigned to the Assignee of the present application.

Circuit simulations of sample and hold circuit 1101 utilizing phase detector circuits 1201 show no sensitivity to the reference clock duty cycle. Other phase detector circuit implementations in laboratory tests showed a sensitivity to the reference clock duty cycle stemming from the level triggered nature of phase detectors implemented simply with cross-coupled logical-NOR gates.

FIG. 13 is a schematic of the polarity checker 1301 circuitry used in the present invention. The example of presently preferred polarity checker 1301 is comprised of six chains of polarity check elements 1311a through 1311dd, each polarity check element 1311 is comprised of a logical-NAND gate 1305 coupled to an inverter 1307. The polarity checker elements 1311 check for synchronous delay line operation in a sub-harmonic mode. Such operation is forbidden and could occur during power-up. If polarity checker 1301 circuitry detects sub-harmonic mode operation, it causes the synchronous delay line to reset by activating output signal RESETEN# 1309. At reset, VCTRL 457 is pulled down to $V_{SS}$. The concept of sub-harmonic modes and the operation of polarity checker circuitry are described in U.S. Pat. No. 4,975,605 entitled "Synchronous Delay Line with Automatic Reset", which is assigned to the Assignee of the present invention.

The preferred embodiment of polarity checker 1301 for use with the present invention is partitioned into six chains of polarity check elements: 1311a through 1311d, 1311e through 1311g, 1311h through 1311o, 1311p through 1311w, 1311x through 1311z, and 1311aa through 1311dd. Polarity check elements 1311a through 1311d are coupled to the even numbered taps of $TAP_O$ through $TAP_6$ of voltage controlled delay line 1303. Polarity check elements 1311e through 1311g are coupled to the odd numbered taps of $TAP_1$ through $TAP_5$. Polarity check elements 1311h through 1311o are coupled to the even numbered taps of $TAP_8$ through $TAP_{22}$, and polarity check elements 1311p through 1311w are coupled to the odd numbered taps of $TAP_7$ through $TAP_{21}$. Finally, polarity check elements 1311x through 1311z are coupled to the even numbered taps of $TAP_{24}$ through $TAP_{28}$, and polarity check elements 1311aa through 1311dd are coupled to the odd numbered taps of $TAP_{23}$ through $TAP_{29}$.

Only polarity check elements 1311h through 1311o actively perform polarity check; the other five chains serve only to load the other taps equivalently to those used in the active chain. Therefore, the chain outputs of the other five chains are left unconnected. Note that each chain of polarity check element is connected to every other tap and not to each tap of voltage controlled delay line 1303 since the delay time through polarity check element 1311 exceeds the minimum interval between two adjacent taps but not the delay time between every other tap.

The first logical-NAND gate of each chain of polarity check elements has an input coupled to a tap from voltage controlled delay line 1303 and the other input coupled to $V_{CC}$. The remaining logical-NAND gates 1305 are coupled to receive the output of inverter 1307 of the preceding polarity check element. Table 1 below summarizes the chain of polarity check connections.

TABLE 1

POLARITY CHECKER CHAIN CONNECTIONS

| TAPS | | CHAIN OUTPUT | |
|---|---|---|---|
| GROUP | ODD/ EVEN TAPS | POLARITY CHECK ELEMENT | USE |
| TAPS 0–6 | ODD | 1311g | NOT-CONNECTED |
|  | EVEN | 1311d | NOT-CONNECTED |
| TAPS 7–22 | ODD | 1311w | NOT-CONNECTED |
|  | EVEN | 1311o | POLARITY CHECK |
| TAPS 23–29 | ODD | 1311dd | NOT-CONNECTED |
|  | EVEN | 1311z | NOT-CONNECTED |

Figure 14:
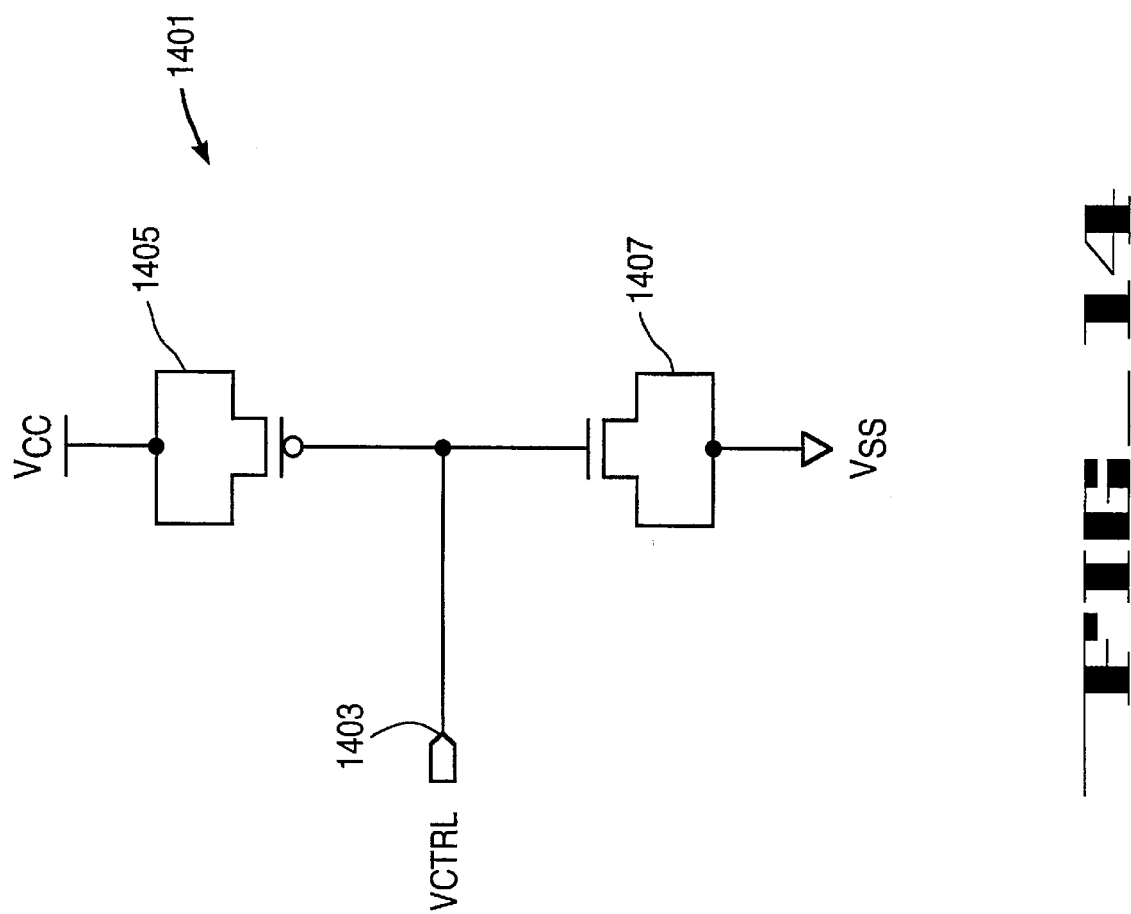
FIG. 14 is a schematic of the control capacitor used in the present invention.

FIG. 14 is a schematic of the preferred embodiment of control capacitor CCTRL 1401 used by the present invention. As the capacitance of control capacitor CCTRL 1401 is increased with respect to the capacitances of capacitors 1139 and 1141 of FIG. 11B, any voltage control signal ripple at VCTRL 1159 is reduced to a negligible value.

Control capacitor $C_{CTRL}$ 1401 comprises an n-type transistor 1407 and p-type transistor 1405 having commonly coupled gates coupled to VCTRL 1403. The source and drain of n-type transistor 1407 are coupled to $V_{SS}$ and the source and drain of p-type transistor 1405 are coupled to $V_{CC}$.

In the preferred embodiment of the present invention, supply noise is coupled to VCTRL 1403 through the voltage divider action of control capacitor CCTRL 1401. For example, if a voltage step appears on $V_{CC}$, a voltage step, reduced in amplitude, also appears on VCTRL. The voltage step on VCTRL 1403 is given by:

$$\Delta VCTRL = \Delta V_{CC} \cdot \frac{1}{1 + \frac{C_{CTRLN}}{C_{CTRLP}}},$$

where $\Delta VCTRL$ is the voltage step that appears on VCTRL 1403 as a result of the voltage step on $V_{CC}$, $\Delta V_{CC}$ is the voltage step on $V_{CC}$, $C_{CTRLN}$ is the capacitance of n-type transistor 1407, and $C_{CTRLP}$ is the capacitance of p-type transistor 1405. In the prior art $C_{CTRLN}/C_{CTRLP}$ ratio was exactly 1.00, so that $\Delta VCTRL=0.5 \, (\Delta V_{CC})$.

When $V_{CC}$ is stepped, VCTRL 1403 must change to a new steady state value. Until VCTRL 1403 attains that new steady state value, the synchronous delay line tap output delays are in error. However, if the $C_{CTRLN}/C_{CTRLP}$ ratio is selected properly, VCTRL changes exactly to its new steady state value instantaneously, so that the delay error appearing on the tap outputs is negligible.

For example, in the case of the synchronous delay line used in the interpolating clock synthesizer, described in co-pending application Ser. No. 394,174, filed Feb. 24, 1995, entitled "Delay Interpolation Circuitry", and assigned to the Assignee of the present application, it was found that a $C_{CTRLN}/C_{CTRLP}$ ratio of 0.59 nulled out the tap delay error under nominal conditions of process file, temperature, $V_{CC}$ and frequency. This null did not exist in other simulation corners but the delay error was greatly reduced, nonetheless, by using this ratio in those corners instead of the prior art ratio of 1.00.

Thus, an improved synchronous delay line is described. Although the present invention has been described in terms of a preferred embodiment, it will be appreciated that various modifications and alterations might be made by those skilled in the art without departing from the spirit and scope of the present invention.

I claim:

1. In a synchronous delay line having a phase generator, a voltage controlled delay line and a sample and hold circuit, the phase generator generating first and second waveforms and first and second in-phase clock waveforms, the voltage controlled delay line receiving the first and second waveforms and generating first and second propagated waveforms, the sample and hold circuit receiving the first and second propagated waveforms and providing a voltage control signal to the phase detector, the synchronous delay line comprising:

reference waveform generation circuitry in the sample and hold circuit, the reference waveform generation circuitry generating first and second reference waveforms in the sample and hold circuit; and comparison circuitry in the sample and hold circuit, the comparison circuitry comparing the first and second propagated waveforms with the first and second reference waveforms, the sample and hold circuit generating the voltage control signal in response to the comparison of the first and second reference waveforms and the first and second propagated waveforms.

2. The synchronous delay line defined in claim 1 wherein the voltage controlled delay line includes a plurality of sequentially coupled voltage controlled delay elements, each voltage controlled delay element including propagation control circuitry, a first one of the plurality of sequentially coupled voltage controlled delay elements coupled to receive the first and second waveforms wherein the first and second waveforms are propagated sequentially through each one of the plurality of sequentially coupled voltage controlled delay elements, the propagation control circuitry in each of the plurality of sequentially coupled voltage controlled delay elements controlling the propagation of the first and second waveforms such that a transition occurring on any one of the first and second waveforms is unable to propagate through the propagation control circuitry until a corresponding transition occurs on the other one of the first and second waveforms.

3. The synchronous delay line defined in claim 2 wherein the first waveform must go to a low level and the second waveform must go to a high level in order for the first propagated waveform to go to a high level.

4. The synchronous delay line defined in claim 3 wherein the first waveform must go to a high level and the second waveform must go to a low level in order for the first propagated waveform to go to a low level.

5. The synchronous delay line defined in claim 4 wherein the first waveform must go to a high level and the second waveform must go to a low level in order for the second propagated waveform to go to a high level.

6. The synchronous delay line defined in claim 5 wherein the first waveform must go to a low level and the second waveform must go to a high level in order for the second propagated waveform to go to a low level.

7. The synchronous delay line defined in claim 6 wherein the propagation control circuitry comprises:

a first p-type transistor, the first p-type transistor source coupled to a first potential, the first p-type transistor gate coupled to receive a first intermediate waveform;

a second p-type transistor, the second p-type transistor source coupled to the first potential, the second p-type transistor gate coupled to receive a second intermediate waveform;

a third p-type transistor, the third p-type transistor source coupled to the first p-type transistor drain;

a fourth p-type transistor, the fourth p-type transistor source coupled to the second p-type transistor drain;

a first n-type transistor, the first n-type transistor drain coupled to the third p-type transistor drain, the first n-type transistor gate coupled to the second p-type transistor drain, the first n-type transistor source coupled to the fourth p-type transistor gate;

a second n-type transistor, the second n-type transistor drain coupled the fourth p-type transistor drain, the second n-type transistor gate coupled to the first p-type transistor drain, the second n-type transistor source coupled to the third p-type transistor gate;

a third n-type transistor, the third n-type transistor drain coupled to the first n-type transistor source, the third n-type transistor gate coupled to receive the first intermediate waveform, the third n-type transistor source coupled to a second potential; and a fourth n-type transistor, the fourth n-type transistor drain coupled to the second n-type transistor source, the fourth n-type transistor gate coupled to receive the second intermediate waveform, the fourth n-type transistor source coupled to the second potential.

8. The synchronous delay line defined in claim 7 wherein a first voltage controlled capacitive load and a first dummy load are coupled to the drain of the first n-type transistor, a second voltage controlled capacitive load and a second dummy load are coupled to the drain of the second n-type transistor, the first and second voltage controlled capacitive loads loading in response to the voltage control signal.

9. The synchronous delay line defined in claim 8 wherein the propagation control circuitry generates a first intermediate propagated waveform at the drain of the first n-type transistor, and a second intermediate propagated waveform at the drain of the second n-type transistor.

10. The synchronous delay line defined in claim 9 wherein there is a first and a last one of the plurality of sequentially coupled voltage controlled delay elements, the first one of the plurality of sequentially coupled voltage controlled delay elements receives the first and second waveforms as the first and second intermediate waveforms, and the first and second propagated waveforms are the first and second intermediate propagated waveforms produced by the last one of the plurality of sequentially coupled voltage controlled delay elements.

11. The synchronous delay line defined in claim 10 wherein the other ones of the plurality of sequentially coupled voltage controlled delay elements receive the first and second intermediate propagated waveforms generated by preceding voltage controlled delay elements as the first and second intermediate waveforms.

12. The synchronous delay line defined in claim 11 wherein the synchronous delay line further comprises a first wave generator in the phase generator, the first wave generator having a first output producing the first waveform, and a second output producing the second waveform.

13. The synchronous delay line defined in claim 12 wherein the first and second outputs of the first wave generator are coupled to a driver circuit.

14. The synchronous delay line defined in claim 12 wherein the driver circuit comprises:

a fifth p-type transistor, the fifth p-type transistor source coupled to the first potential, the fifth p-type transistor gate coupled to receive a second quadrature clock waveform;

a sixth p-type transistor, the sixth p-type transistor source coupled to the first potential, the sixth p-type transistor gate coupled to receive a first quadrature clock waveform;

a seventh p-type transistor, the seventh p-type transistor source coupled to the fifth p-type transistor drain, the seventh p-type transistor gate coupled to an inverted clock waveform;

an eighth p-type transistor, the eighth p-type transistor source coupled to the sixth p-type transistor drain, the eighth p-type transistor gate coupled to the inverted clock waveform;

a fifth n-type transistor, the fifth n-type transistor drain coupled to the seventh p-type transistor drain, the fifth n-type transistor gate coupled to a clock waveform;

a sixth n-type transistor, the sixth n-type transistor drain coupled the eighth p-type transistor drain, the sixth n-type transistor gate coupled to the clock waveform;

a seventh n-type transistor, the seventh n-type transistor drain coupled to the fifth n-type transistor source, the seventh n-type transistor gate coupled to receive the second quadrature clock waveform, the seventh n-type transistor source coupled to the second potential; and an eighth n-type transistor, the eighth n-type transistor drain coupled to the sixth n-type transistor source, the eighth n-type transistor gate coupled to receive the first quadrature clock waveform, the eighth n-type transistor source coupled to the second potential.

15. The synchronous delay line defined in claim 14 wherein a third dummy load is coupled to the driver circuit, the third dummy load comprising:

a ninth p-type transistor, the ninth p-type transistor gate coupled to the fifth n-type transistor source, the ninth p-type transistor source and drain coupled to the first potential;

a tenth p-type transistor, the tenth p-type transistor gate coupled to the sixth n-type transistor source, the tenth p-type transistor source and drain coupled to the first potential;

a ninth n-type transistor, the ninth n-type transistor gate coupled to the fifth p-type transistor drain, the ninth n-type transistor source and drain coupled to the second potential; and a tenth n-type transistor, the tenth n-type transistor gate coupled to the sixth p-type transistor drain, the tenth n-type transistor source and drain coupled to the second potential.

16. The synchronous delay line defined in claim 15 wherein the ninth n-type transistor is substantially similar to the second n-type transistor, the tenth p-type transistor is substantially similar to the first n-type transistor, the ninth t-type transistor is substantially similar to the fourth p-type transistor, and the tenth p-type transistor is substantially similar to the third p-type transistor.

17. The synchronous delay line defined in claim 16 wherein the first output is generated at the seventh p-type transistor drain and the second output is generated at the eighth p-type transistor drain.

18. The synchronous delay line defined in claim 17 wherein the first output is further coupled to a third voltage controlled capacitive load, the first and third voltage controlled capacitive loads being substantially similar, and second output is further coupled to a fourth voltage controlled capacitive load, the second and fourth voltage controlled capacitive loads being substantially similar, the third and fourth voltage controlled capacitive loads loading in response to the voltage control signal.

19. The synchronous delay line defined in claim 18 wherein the first output is further coupled to a first active network, the first active network and the first dummy load having substantially similar parasitic load effects, and the second output is further coupled to a second active network, the second active network and the second dummy load having substantially similar parasitic load effects.

20. The synchronous delay line defined in claim 19 wherein the first active network is comprised of:

an eleventh n-type transistor, the eleventh n-type transistor drain coupled to the first output, the eleventh n-type transistor source coupled to receive the first in-phase clock waveform, the eleventh n-type transistor gate coupled to receive the inverted clock waveform; and an eleventh p-type transistor, the eleventh p-type transistor drain coupled to the first output, the eleventh p-type transistor source coupled to receive the first in-phase clock waveform, the eleventh p-type transistor gate coupled to receive the clock waveform.

21. The synchronous delay line defined in claim 20 wherein the first dummy load is comprised of:

a twelfth n-type transistor, the twelfth n-type transistor drain coupled to the drain of the first n-type transistor, the twelfth n-type transistor source and gate coupled to the second potential; and a twelfth p-type transistor, the twelfth p-type transistor drain coupled to the drain of the first n-type transistor, the twelfth p-type transistor source and gate coupled to the first potential.

22. The synchronous delay line defined in claim 21 wherein the second active network is comprised of:

a thirteenth n-type transistor, the thirteenth n-type transistor drain coupled to the second output, the thirteenth n-type transistor source coupled to receive the second in-phase clock waveform, the thirteenth n-type transistor gate coupled to receive the inverted clock waveform; and a thirteenth p-type transistor, the thirteenth p-type transistor drain coupled to the second output, the thirteenth p-type transistor source coupled to receive the second in-phase clock waveform, the thirteenth p-type transistor gate coupled to receive the clock waveform.

23. The synchronous delay line defined in claim 22 wherein the second dummy load is comprised of:

a fourteenth n-type transistor, the fourteenth n-type transistor drain coupled to the drain of the second n-type transistor, the fourteenth n-type transistor source and gate coupled to the second potential; and a fourteenth p-type transistor, the fourteenth p-type transistor drain coupled to the drain of the second n-type transistor, the fourteenth p-type transistor source and gate coupled to the first potential.

24. The synchronous delay line defined in claim 23 wherein the first and second reference waveforms are complemented replicas of the first and second intermediate propagated waveforms generated by the first voltage controlled delay element.

25. The synchronous delay line defined in claim 24 wherein the reference waveform generation circuitry in the sample and hold circuit comprises a second waveform generator coupled to a first auxiliary voltage controlled delay element, the first and second waveform generators being substantially similar, the first auxiliary voltage controlled delay element being substantially similar to the first voltage controlled delay element, the first auxiliary voltage controlled delay element generating the first and second reference waveforms.

26. The synchronous delay line defined in claim 25 wherein the sample and hold circuit further comprises a second auxilliary voltage controlled delay element, the second auxiliary voltage controlled delay element receiving the first and second propagated waveforms from the voltage controlled delay line, the second auxiliary voltage controlled delay element generating first and second delayed waveforms.

27. The synchronous delay line defined in claim 26 wherein the sample and hold circuit compares the first and second reference waveforms with the first and second delayed waveforms with first and second phase detectors.

28. The synchronous delay line defined in claim 27 wherein the sample and hold circuit generates first and second sample enable signals in response to the first and second in-phase clock waveforms and the clock waveform, the first and second enable signals alternating between high and low levels such that when the first sample enable signal is at a high level, the second sample enable signal is at a low level, and when the first enable signal is at a low level, the second sample enable signal is at a high level.

29. The synchronous delay line defined in claim 28 wherein the first and second phase detectors generate first and second phase detector outputs in response to transitions occurring in the first and second reference waveforms, the first and second delayed waveforms, and the first and second sample enable signals.

30. The synchronous delay line defined in claim 29 wherein the sample and hold circuit further comprises a pass network coupled to the outputs of the first and second phase detectors, the pass network generating the voltage control signal.

31. The synchronous delay line defined in claim 30 wherein the pass network comprises:

a first inverter coupled to a lag output of the first phase detector;

a second inverter coupled to a lag output of the second phase detector;

a first pass gate transmitting the output of the first inverter to a third pass gate;

a first capacitor coupled to the output of the first pass gate;

a second pass gate transmitting the output of the second inverter to a fourth pass gate, the output of the fourth pass gate coupled to the output of the third pass gate; and a second capacitor coupled to the output of the second pass gate.

32. The synchronous delay line defined in claim 31 wherein the first and fourth pass gates are activated in alternation with the second and third pass gates in response to the first and second sample enable signals.

33. The synchronous delay line defined in claim 32 wherein the voltage control signal is generated at a voltage control signal output, wherein the voltage control signal output is the outputs of the third and fourth pass gates.

34. The synchronous delay line defined in claim 33 wherein the sample and hold circuit further comprises a control capacitor coupled to the voltage control signal output, the control capacitor reducing ripple in the voltage control signal to a negligible value.

35. The synchronous delay line defined in claim 34 wherein the voltage control signal changes to a substantially steady state value instantaneously with the control capacitor when a voltage step appears on the first potential.

36. The synchronous delay line defined in claim 35 wherein the control capacitor comprises a fifteenth n-type transistor having a first capacitance and a fifteenth p-type transistor having a second capacitance, the gates of the fifteenth n-type and fifteenth p-type transistors coupled to the voltage control signal, the source and drain of the fifteenth p-type transistor coupled to the first potential, the source and drain of the fifteenth n-type transistor coupled to the second potential.

37. The synchronous delay line defined in claim 36 wherein the ratio of the first capacitance to the second capacitance is selected in order to minimize sensitivity to noise on the first potential or the second potential.

38. The synchronous delay line defined in claim 37 wherein the first potential is $V_{CC}$ and the second potential is $V_{SS}$.

39. A synchronous delay line comprising:
   a phase generator generating first and second waveforms and first and second in-phase waveforms;
   a voltage controlled delay line coupled to the phase generator, the voltage controlled delay line receiving the first and second propagated waveforms and generating first and second propagated waveforms;
   a sample and hold circuit coupled to receive the first and second waveforms and the first and second in-phase waveforms, the sample and hold circuit generating in response to the first and second propagated waveforms and the first and second in-phase waveforms a voltage control signal coupled to the phase generator and the voltage controlled delay line, the sample and hold circuit including:
      reference waveform generation circuitry generating first and second reference waveforms in response to the first and second in-phase waveforms; and
      comparison circuitry comparing the first and second propagated waveforms with first and second reference waveforms, the sample and hold circuit generating the voltage control signal in response to the comparison of the first and second propagated waveforms and the first and second reference waveforms.

40. The synchronous delay line defined in claim 39 wherein the voltage controlled delay line includes propagation control circuitry, wherein the first and second waveforms propagate through first and second signal paths respectively, the propagation control circuitry controlling propagation of the first and second waveforms such that a transition occurring on any one of the first and second waveforms is unable to propagate through the propagation control circuitry until a corresponding transition occurs on the other one of the first and second waveforms.

41. The synchronous delay line defined in claim 40 wherein the first waveform must go to a low level and the second waveform must go to a high level before the propagation circuitry propagates the first waveform to a high level.

42. The synchronous delay line defined in claim 41 wherein the first waveform must go to a high level and the second waveform must go to a low level before the propagation circuitry propagates the first waveform to a low level.

43. The synchronous delay line defined in claim 42 wherein the first waveform must go to a high level and the second waveform must go to a low level before the propagation circuitry propagates the second waveform to a high level.

44. The synchronous delay line defined in claim 43 wherein the first waveform must go to a low level and the second waveform must go to a high level before the propagation circuitry propagates the second waveform to a low level.

45. The synchronous delay line defined in claim 44 wherein the voltage controlled delay line comprises a plurality of series connected voltage controlled delay elements including a first voltage controlled delay element and a last voltage controlled delay element, the first voltage controlled delay element receiving the first and second waveforms, the last voltage controlled delay element generating the first and second propagated waveforms, each of the plurality of voltage controlled delay elements including the propagation control circuitry.

46. The synchronous delay line defined in claim 45 wherein the first and second reference waveforms are inverted replicas of the first and second intermediate propagated waveforms output by the first voltage controlled delay element.

47. The synchronous delay line defined in claim 46 wherein the sample and hold circuit further comprises an auxiliary voltage controlled delay element receiving the first and second propagated waveforms and generating first and second delayed waveforms.

48. The synchronous delay line defined in claim 47 wherein the comparison circuitry comprises first and second phase detectors coupled to detect phase differences between the first and second reference waveforms and the first and second delayed waveforms.

49. The synchronous delay line defined in claim 48 wherein the voltage control signal is generated by the sample and hold circuit in response to the phase differences between the first and second reference waveforms and the first and second delayed waveforms.

50. The synchronous delay line defined in claim 41 wherein the phase generator includes a wave generator, the wave generator generating the first and second waveforms.

51. The synchronous delay line defined in claim 50 wherein the wave generator generates the first waveform in a third signal path, and the wave generator generates the second waveform in a fourth signal path.

52. The synchronous delay line defined in claim 51 wherein parasitic load loading the first signal path is substantially similar to parasitic load loading the third signal path, and a parasitic load loading the second signal path is substantially similar to a parasitic load loading the fourth signal path.

53. The synchronous delay line defined in claim 39 wherein the synchronous delay line further comprises a control capacitor coupled to the voltage control signal, the control capacitor reducing jitter in the voltage control signal to a negligible value.

54. The synchronous delay line defined in claim 53 wherein the voltage control signal changes to a substantially steady state value instantaneously with the control capacitor when a voltage step appears on $V_{CC}$.

55. The synchronous delay line defined in claim 54 wherein the control capacitor comprises an n-type transistor having first capacitance and a p-type transistor having a second capacitance, the gates of the n-type and p-type transistors coupled to the voltage control signal, the source and drain of the p-type transistor coupled to $V_{CC}$, the source and drain of the n-type transistor coupled to $V_{SS}$.

56. The synchronous delay line defined in claim 55 wherein the ratio of the first capacitance to the second capacitance is selected in order to minimize sensitivity to noise on $V_{CC}$ or $V_{SS}$.

* * * * *

UNITED STATES PATENT AND TRADEMARK OFFICE
CERTIFICATE OF CORRECTION

| | | |
|---|---|---|
| PATENT NO. | : | 5,581,207 |
| DATED | : | December 3, 1996 |
| INVENTOR(S) | : | Mel Bazes |

It is certified that error appears in the above-identified patent and that said Letters Patent is hereby corrected as shown below:

In column 4 at line 43 delete "alter" and insert --alternately charge--

In column 8 at line 49 delete "WVQA" and insert --WVOA--

In column 10 at line 23 delete "t-type" and insert --p-type--

In column 17 at line 23 delete "$C_{CTRL}$" and insert --CCTRL--

In column 18 at line 2 delete "In a" and insert --A--

In column 20 at line 50 delete "p-type" and insert --n-type--

In column 20 at line 52 delete "t-type" and insert --p-type--

In column 22 at line 3 delete "auxilliary" and insert --auxiliary--

Signed and Sealed this

Eighth Day of April, 1997

Attest:

BRUCE LEHMAN

*Attesting Officer*   *Commissioner of Patents and Trademarks*